(12) United States Patent
Reddy et al.

(10) Patent No.: US 12,387,995 B1
(45) Date of Patent: Aug. 12, 2025

(54) SYSTEMS AND METHODS FOR COOLING ELECTRONIC CIRCUITS

(71) Applicant: Auradine, Inc., Santa Clara, CA (US)

(72) Inventors: Anuya Reddy, Pleasanton, CA (US); Lyle Looney, Livermore, CA (US); Pranav Kalyanraman, Santa Clara, CA (US); Larry Yu, Santa Clara, CA (US)

(73) Assignee: Auradine, Inc., Santa Clara, CA (US)

( * ) Notice: Subject to any disclaimer, the term of this patent is extended or adjusted under 35 U.S.C. 154(b) by 0 days.

(21) Appl. No.: 18/967,100

(22) Filed: Dec. 3, 2024

(51) Int. Cl.
- *H01L 23/427* (2006.01)
- *H01L 23/00* (2006.01)
- *H01L 25/065* (2023.01)

(52) U.S. Cl.
CPC .......... *H01L 23/427* (2013.01); *H01L 24/32* (2013.01); *H01L 25/0655* (2013.01); *H01L 2224/32245* (2013.01); *H01L 2924/2064* (2013.01)

(58) Field of Classification Search
CPC ... H01L 23/427; H01L 24/32; H01L 25/0655; H01L 2224/32245; H01L 2924/2064
USPC ........................................................ 257/712
See application file for complete search history.

(56) References Cited

U.S. PATENT DOCUMENTS

| | | |
|---|---|---|
| 6,588,498 B1 * | 7/2003 | Reyzin ............... F28D 15/0266 174/15.2 |
| 8,018,720 B2 | 9/2011 | Campbell et al. |
| 9,261,308 B2 | 2/2016 | Campbell et al. |
| 9,357,675 B2 | 5/2016 | Campbell et al. |
| 11,721,607 B2 | 8/2023 | Uppal et al. |
| 12,035,508 B2 | 7/2024 | Enright et al. |
| 2004/0036183 A1 | 2/2004 | Im et al. |
| 2007/0045819 A1 | 3/2007 | Edwards et al. |
| 2013/0021752 A1 | 1/2013 | Campbell et al. |
| 2016/0081197 A1 * | 3/2016 | Arvelo ................ H01L 23/473 29/832 |
| 2023/0088049 A1 | 3/2023 | Salmon |
| 2023/0180434 A1 * | 6/2023 | Shia ................... H05K 7/20381 361/700 |

* cited by examiner

*Primary Examiner* — Jasmine J Clark
(74) *Attorney, Agent, or Firm* — Fish & Richardson P.C.

(57) ABSTRACT

Examples of devices for providing cooling solutions are described. One example device includes a substrate, one or more integrated circuit (IC) chips placed on the substrate, and a boilerplate including one or more rails. At least one rail of the one or more rails includes a recess in a surface of the at least one rail that faces the one or more IC chips. The recess includes outer walls contacting the one or more IC chips and forming a cavity for accommodating a thermal interface material (TIM) coupled to the one or more IC chips.

20 Claims, 17 Drawing Sheets

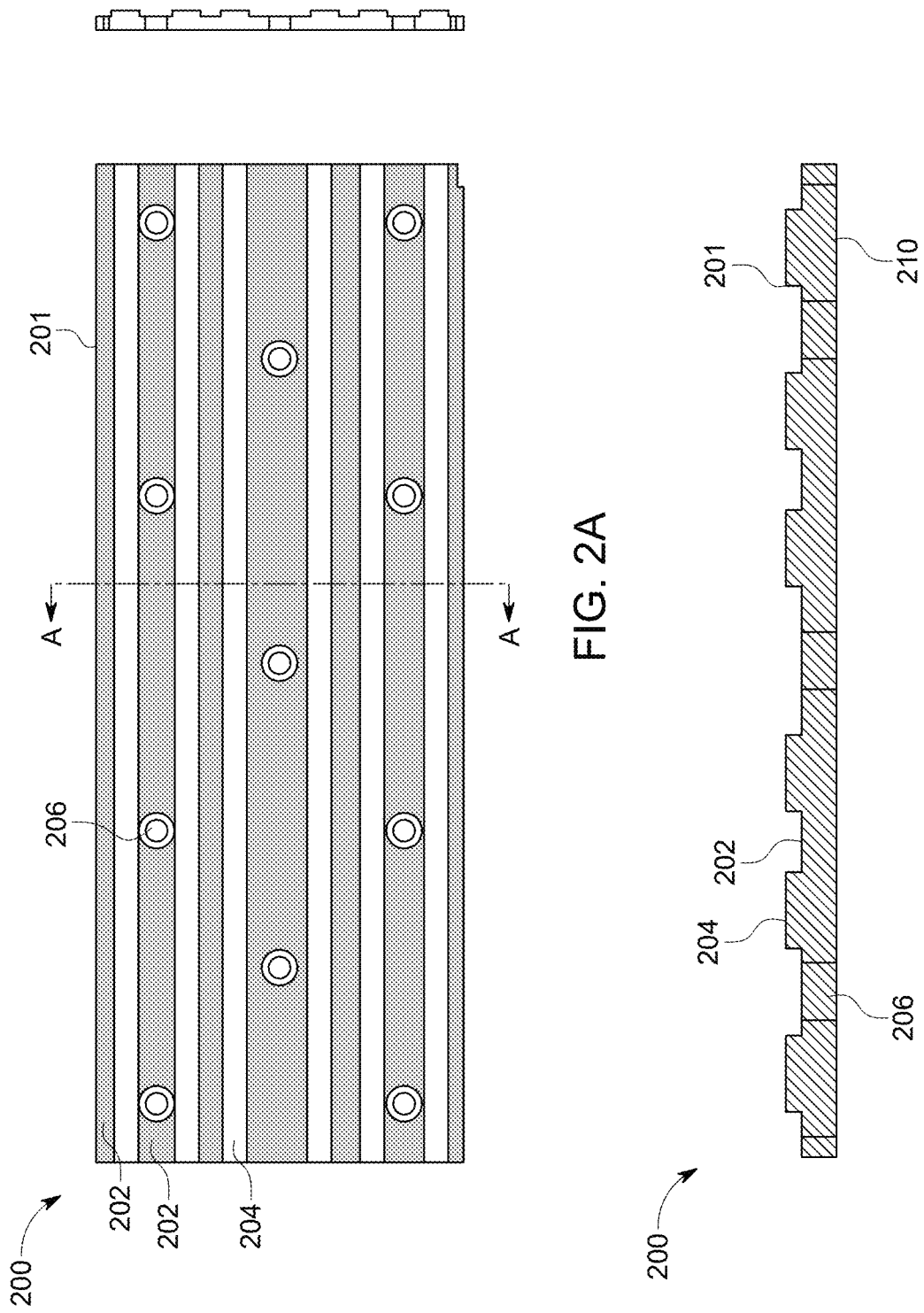

SYSTEMS AND METHODS FOR COOLING ELECTRONIC CIRCUITS

TECHNICAL FIELD

The following disclosure generally relates to systems and methods for cooling electronic circuits, and in particular, to techniques used in immersion cooling systems.

BACKGROUND

In various industrial and electronic applications, mechanisms are used to regulate the temperature of electronic circuits during operation. These mechanisms include boilerplates or other structural elements or materials for facilitating thermal management.

SUMMARY

The present disclosure describes methods and systems for providing cooling solutions in immersion cooling systems. The disclosed methods and systems include boilerplates for thermal regulation.

In a general aspect, a device comprises: a substrate; one or more integrated circuit (IC) chips placed on the substrate; and a boilerplate comprising one or more rails. At least one rail of the one or more rails comprises a recess in a surface of the at least one rail that faces the one or more IC chips. The recess comprises outer walls contacting the one or more IC chips and forming a cavity for accommodating a thermal interface material (TIM) coupled to the one or more IC chips.

Particular implementations may include one or more of the following features.

In some implementations, the at least one rail comprises a plurality of sections that are separated from each other. Each one of the plurality of sections comprises a recess that corresponds to a respective IC chip of the one or more IC chips and that comprises outer walls forming a cavity for accommodating a TIM coupled to the respective IC chip.

In some implementations, the boilerplate comprise a first surface coupled to the one or more IC chips and a second surface opposite the first surface, and wherein the second surface has a roughness exceeding a predetermined threshold.

In some implementations, the second surface of the boilerplate has a roughness within a range of 1.7 to 2.3 micrometers.

In some implementations, the roughness of the second surface of the boilerplate comprises a plurality of ridges with intervening valleys.

In some implementations, the roughness of the second surface of the boilerplate is processed using one of sand blasting or bead blasting.

In some implementations, the boilerplate comprises a thermally conductive material.

In some implementations, the TIM comprises one of the following: a thermal paste, a thermal adhesive, a thermal conductive pad, a thermal tape, or a phase-change material.

In another aspect, a device comprises: a substrate; one or more integrated circuit (IC) chips placed on the substrate; and a boilerplate comprising a first surface coupled to the one or more IC chips and a second surface opposite the first surface. The second surface has a roughness exceeding a predetermined threshold, and the roughness of the second surface comprises a plurality of ridges with intervening valleys.

Particular implementations may include one or more of the following features.

In some implementations, the second surface of the boilerplate has a roughness within a range of 1.7 to 2.3 micrometers.

In some implementations, the roughness of the second surface of the boilerplate is processed using one of sand blasting or bead blasting.

In some implementations, the boilerplate comprises one or more rails, at least one rail of the one or more rails comprises a recess in a surface of the at least one rail that faces the one or more IC chips, and the recess comprises outer walls contacting the one or more IC chips and forming a cavity for accommodating a thermal interface material (TIM) coupled to the one or more IC chips.

In some implementations, the at least one rail comprises a plurality of sections that are separated from each other, where each one of the plurality of sections comprises a recess that corresponds to a respective IC chip of the one or more IC chips and that comprises outer walls forming a cavity for accommodating a TIM coupled to the respective IC chip.

In some implementations, the TIM comprises one of the following: a thermal paste, a thermal adhesive, a thermal conductive pad, a thermal tape, or a phase-change material.

In some implementations, the boilerplate comprises a thermally conductive material.

In yet another aspect, a boilerplate is provided for coupling to one or more integrated circuit (IC) chips placed on a printed circuit board (PCB). The boilerplate comprises one or more rails, where at least one rail of the one or more rails comprises a recess in a surface of the at least one rail that faces the one or more IC chips, where the recess comprises outer walls contacting the one or more IC chips and forming a cavity for accommodating a thermal interface material (TIM) coupled to the one or more IC chips. The boilerplate comprises a first surface coupled to the one or more IC chips and a second surface opposite the first surface, where the second surface has a roughness exceeding a predetermined threshold, and the roughness of the second surface comprises a plurality of ridges with intervening valleys.

Particular implementations may include one or more of the following features.

In some implementations, the at least one rail comprises a plurality of sections that are separated from each other, where each one of the plurality of sections comprises a recess that corresponds to a respective IC chip of the one or more IC chips and that comprises outer walls forming a cavity for accommodating a TIM coupled to the respective IC chip.

In some implementations, the boilerplate comprises a thermally conductive material.

In some implementations, the second surface of the boilerplate has a roughness within a range of 1.7 to 2.3 micrometers.

In some implementations, the roughness of the second surface of the boilerplate is processed using one of sand blasting or bead blasting.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

FIGS. 2A-2C illustrate perspective views of an example boilerplate, according to one or more implementations of the present disclosure.

Like reference numbers and designations in the various drawings indicate like elements.

DETAILED DESCRIPTION

Figure 1A:
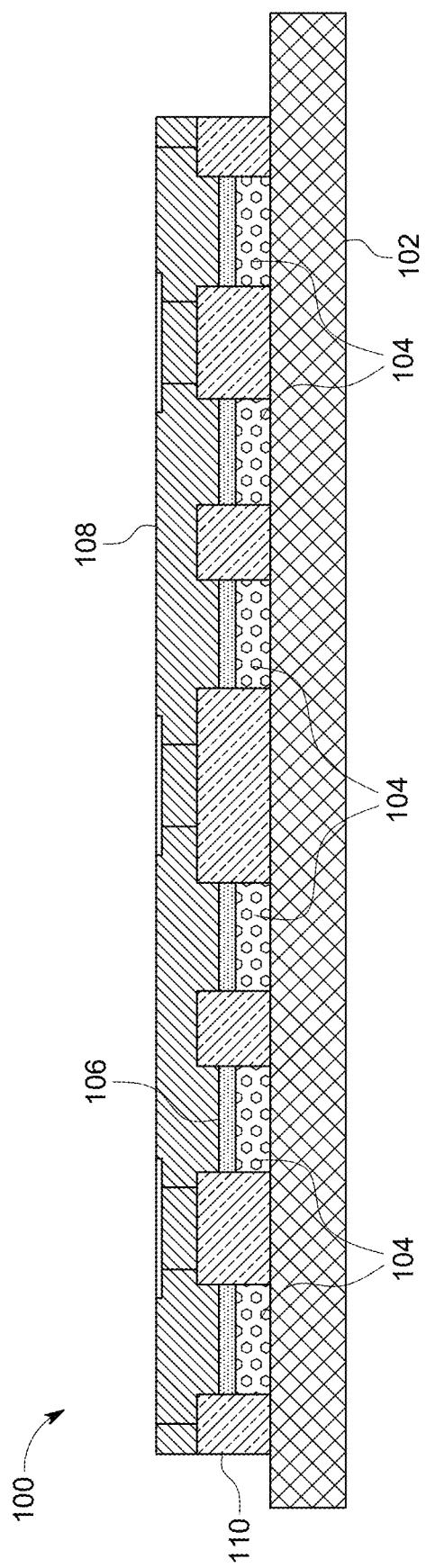
FIGS. 1A and 1B illustrate an example electronic device, according to one or more implementations of the present disclosure.

A large number of IC chips, including application specific ICs (ASICs), can be assembled on an electronic circuit board, such as a printed circuit board (PCB), to perform complex computing tasks, such as parallel cryptographic hash computations for blockchain operations. The PCB (also referred to as circuit board or simply, board) typically includes ports to supply voltage and ground to the IC chips, as well as ports for data input and output. In tasks such as cryptocurrency mining, the performance of a PCB is tied to the computation power, which is proportional to the number of IC chips assembled on the board. Consequently, increasing the chip density on a single board is desirable to maximize computational output. Cryptocurrencies, such as Bitcoin, Ethereum, Kaspa, and Tether, rely on blockchain technology for verification, which hinges on these intensive computational processes.

A circuit board may be coupled to a boilerplate, which can be a thermally conductive metal substrate designed to facilitate dissipating heat generated during chip operation. The coupling of the circuit board and the boilerplate is done such that the IC chips on the circuit board are in physical contact with the boilerplate, which is configured to maintain proper operating temperatures, thereby enhancing chip performance, reliability, and longevity. The boilerplate can also be integrated with additional cooling systems, such as forced air or liquid cooling, to further improve heat dissipation efficiency. In some cases, a thermal interface material (TIM) is applied to the individual IC chips to provide an interface between the corresponding IC chip and the boilerplate, for effective heat dissipation.

While the boilerplate (and/or the TIM) provides effective thermal management on its own, integrating it within an immersion cooling system can further enhance overall heat dissipation capabilities. Immersion cooling is a system that employs the high heat capacity and rapid heat transport characteristics of a two-phase cooling fluid to manage substantial heat loads. This approach can be particularly effective for cooling electronic devices running applications that generate high heat output, such as cryptocurrency mining, large language models (LLMs) for generative artificial intelligence (Gen AI) systems, hyperscale computing, or supercomputers, among others. In immersion cooling systems, high heat flux components, including central processing units (CPUs) and/or graphics processing units (GPUs) (e.g., with large numbers of ASICs arranged on PCBs), are submerged in a tank of thermally conductive dielectric liquid, where heat is transferred away from the source via a boilerplate.

Immersion cooling can substantially increase cooling capacity, enabling higher processing power and increased electronic density. Two-phase immersion cooling can eliminate the need for complex air flow management and tube routing that is required in air or direct liquid systems, thereby simplifying hardware design, reducing development cycles, and streamlining assembly. Immersion cooling can enable components of the system to receive immediate and balanced cooling, as the components are directly exposed to the cool ambient liquid without preheating from upstream components. The heat transfer mechanism may reduce or eliminate the need for local pumps and fans, resulting in quieter operation and enhanced noise safety.

In addition, or as an alternative to using an immersion cooling system, boilerplates can be mounted to high-performance IC chips (e.g., coupled to the PCB with IC chips) to remove heat rapidly and efficiently from sensitive components. The boilerplate can provide additional surface area for heat capture and dissipation. In liquid immersion cooling systems, a boilerplate attached to the heat source (e.g., PCB with IC chips) is submerged in a dielectric fluid. The fluid boils upon contact with the boilerplate, absorbing heat from both the boilerplate and the associated heat source. The resulting bubbles rise through the fluid, transporting the heat to the surface, where it is expelled from the system via a heat exchanger or coil.

In some cases, when a thermal interface material (TIM) is applied between the boilerplate and the IC chips, turbulent boiling action within the immersion cooling system (e.g., generation of bubbles and/or heat-based currents in the immersion fluid) may displace the TIM. Furthermore, exposure to dielectric fluid can cause the TIM to become brittle, increasing its susceptibility to washout. The present disclosure describes techniques to address these issues, including positioning one or more gaskets surrounding the IC chips. The gasket, such as a compliant sealant, is configured to be placed around the perimeter of the IC chips and/or the boilerplate, thereby reducing fluid agitation in proximity to the IC chips and protecting the TIM from displacement. By reducing contact between the dielectric fluid and the TIM, the gasket can prevent the TIM from being displaced due to the forceful impact of the boiling fluid.

Figure 1B:
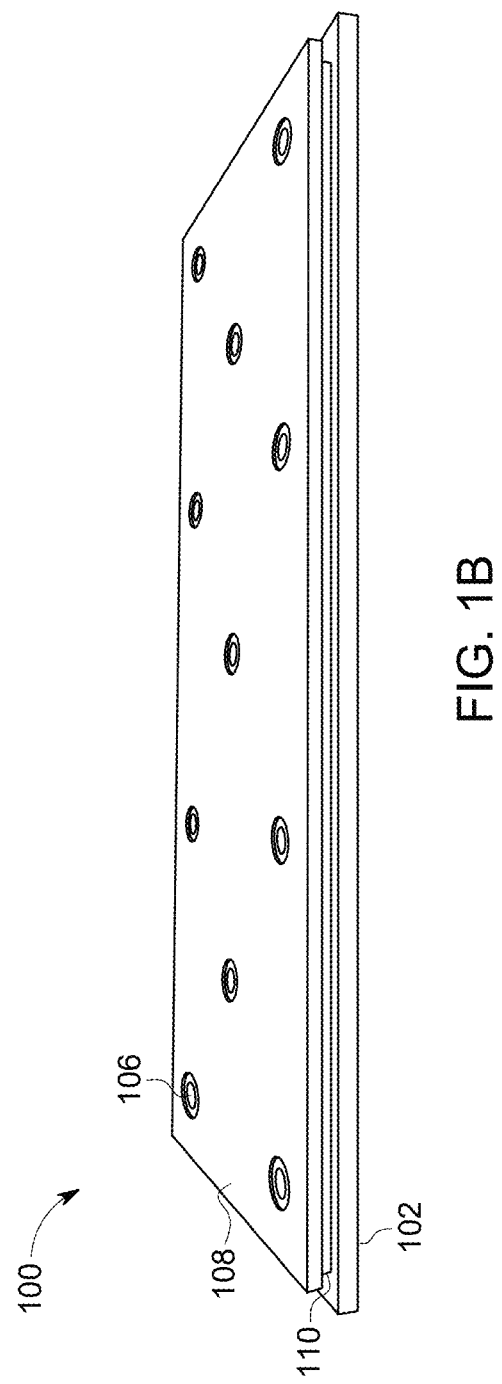

FIGS. 1A and 1B illustrate an example electronic device 100, according to one or more implementations of the present disclosure. As shown, the device 100 includes a PCB 102, IC chips 104, TIM 106, a boilerplate 108, and gaskets 110. In some implementations, the device 100 is an electronic circuit device that is configured to perform operations for applications that generate high heat output, such as cryptocurrency mining, large language models (LLMs) for Gen AI systems, hyperscale computing, and or supercomputers, among others.

In some implementations, the PCB 102 comprises a substrate and a non-conductive base material. The substrate can be a material or structure that serves as the foundation for microelectronic devices, such as transistors, diodes, and integrated circuits. The substrate can provide structural support, electrical connectivity, and a canvas for circuitry. In some implementations, the substrate includes a material such as silicon, silicon dioxide, aluminum oxide, sapphire, germanium, gallium arsenide (GaAs), an alloy of silicon and germanium, or indium phosphide (InP).

In some implementations, the PCB 102 is a platform for mounting and electrically connecting various electronic components, such as IC chips 104. The PCB 102 can consist of a non-conductive base material that supports layers of conductive pathways or traces. These traces can be made from copper sheets laminated onto or between the layers of the substrate. The conductive traces create electrical connections between the components mounted on the board (e.g., IC chips), enabling the electronic device to function according to its design.

In some examples, the PCB 102 can include a base material that provides mechanical support and electrical insulation. The base material can be FR4, a fiberglass-reinforced epoxy laminate, which offers a balance of strength, durability, and insulation properties. The base material can be other materials such as polyimide, ceramic, and metal-core substrates.

In some examples, copper layers are applied to the base material of the PCB 102 to form the conductive traces. These traces are responsible for connecting the components on the PCB 102. The PCB 102 may have one or more layers of copper. To protect the copper traces and prevent short circuits, a solder mask can be applied over the traces. This mask also provides protection against environmental factors and helps guide solder during the assembly process. A silkscreen layer can be applied on top of the solder mask, adding labels, component identifiers, and other markings that assist in the assembly and troubleshooting of the board.

In some examples, the PCB can be a single-layer PCB, a double-layer PCB, a multi-layer PCB, a rigid PCB, a flexible PCB, or a rigid-flex PCB. Single-layer PCBs, which include one layer of copper on one side of the base material, can be used in simpler electronic devices like calculators and household appliances. Double-layer PCBs, which include copper layers on both sides of the base material, can be used in more complex circuits such as automotive electronics and industrial controls. Multi-layer PCBs, which include multiple layers of copper separated by insulating layers, can be used in high-density designs for devices such as computers and smartphones. Rigid PCBs, which include solid and inflexible base material, can be used in applications requiring a stable structure, such as in desktop computers and televisions. Flexible PCBs, which include flexible plastic base materials, can be employed in applications that require the board to bend or flex, such as in wearable devices and medical equipment. Rigid-flex PCBs, which combine rigid and flexible sections and allow for applications that require both stability and flexibility, can be used in aerospace and military equipment.

In addition to IC chips 104, other electronic components such as resistors, capacitors, diodes, and/or transistors can be mounted on the PCB 102. These components are connected to the PCB either through through-hole technology, where leads pass through holes in the board, or surface-mount technology, where components are mounted directly onto the surface of the PCB.

IC chips 104 are positioned on the PCB 102. In some implementations, the IC chips 104 are integrated on the PCB 102. In some cases, the IC chips 104 are mounted on the PCB 102 using various methods. For example, the IC chips can be mounted on the PCB 102 using through-hole mounting, where leads pass through holes in the board, or surface-mount technology (SMT), where the chip is placed directly onto the surface of the PCB.

In some implementations, an IC chip 104 includes a semiconductor wafer that contains integrated circuits and functional components of an electronic device, such as transistors, capacitors, resistors, and other circuit elements that allow the device to perform its designated functions. In some examples, an IC chip 104 can be fabricated from a larger wafer, which undergoes a series of photolithographic and chemical processes to create the integrated circuits on its surface. These processes include doping, etching, and deposition, which form the various circuit elements on the wafer. Once the fabrication process is complete, the wafer is diced into individual dies, each containing a complete set of circuits.

Each IC chip 104 can be a self-contained unit that can be further packaged and connected to other components in the electronic device 100. The IC chip 104 can serve various functions depending on their design and the circuits they contain. In some examples, an IC chip 104 can be a custom-designed chip, such as an ASIC, created for specific applications or functions, such as cryptocurrency mining, performing LLM operations for Gen AI applications, network processing, or image processing. In some examples, an IC chip 104 can include a System-on-Chip (SoC) that integrates all the components of a computer or other electronic system onto a single chip, including the CPU, memory, input/output ports, and other functions. In some examples, an IC chip 104 can be an analog and mixed-signal chip that processes analog signals, which are continuous signals representing physical quantities, or that combines analog and digital processing on a single chip, including operational amplifiers, analog-to-digital converters (ADCs), and digital-to-analog converters (DACs).

In some implementations, an IC chip 104 is packaged for coupling to the PCB. In some examples, the package includes conductive elements such as pins, pads, or bumps, which are used to connect the IC chip 104 to a PCB, such as the PCB 102. These connections allow an IC chip 104 to communicate with other components in the system, such as other IC chips 104 on the PCB 102, memory, sensors, and power supplies. In some cases, the package helps to protect the IC chip 104 from environmental hazards such as moisture, dust, and mechanical stress. The package facilitates the dissipation of heat generated during the chip's operation.

In some implementations, TIM 106 is applied to one or more IC chips 104, such that the TIM 106 is positioned between an IC chip 104 on which it is applied and the boilerplate 108. In some implementations, the TIM 106 is a substance formed of a material with high thermal conductivity and is used to enhance the thermal connection between surfaces of heat-generating components, such as the IC chips 104, and the boilerplate 108. The TIM 106 is used to fill microscopic air gaps and surface irregularities that exist between surfaces of the IC chips 104 and the boilerplate 108, thereby improving the efficiency of heat transfer from the IC chips 104 to the boilerplate 108. The TIM 106 is used to manage the heat generated by the IC chips 104, ensuring that these chips and the electronic device 100 operate within their optimal temperature ranges.

In some examples, the TIM 106 is applied to the surfaces (e.g., coated on the surfaces) of the IC chips 104 that face the boilerplate 108. The TIM 106 covers the contact surface area between the IC chips 104 and the boilerplate 108, thereby ensuring efficient thermal coupling between the IC chips 104 and the boilerplate 108. This arrangement facilitates effective heat transfer from the IC chips 104 to the boilerplate 108, improving the thermal management of the system.

In some implementations, the TIM 106 can have various forms, including pastes, pads, adhesives, greases, and phase-change materials. In some examples, the TIM 106 can be a thermal paste or grease, which is a semi-fluid material applied as a thin layer between the heat source (e.g., an IC chip 104) and the heat sink (e.g., boilerplate 108). The thermal paste or grease can be composed of thermally conductive particles, such as metal oxides or advanced materials like silver, suspended in a silicone or non-silicone base. In some examples, the TIM 106 can be a thermal pad, which can be made from silicone, or elastomeric materials filled with thermally conductive particles. In some examples, the TIM 106 can be a phase-change material (PCM) that exists in a solid state at room temperature but softens or melts at operating temperature. In some examples, the TIM can be a thermally conductive adhesive that provides both thermal conductivity and bonding between components, e.g., an IC chip 104 and the boilerplate 108. In some examples, the TIM 106 can be a liquid metal, such as a gallium-based alloy which offers high thermal conductivity for high-performance applications.

In some implementations, the boilerplate 108 is a thermally conductive metal substrate. In some examples, the boilerplate 108 can be made of a metal with high thermal conductivity, such as copper or aluminum. The boilerplate 108 can be used to transfer heat away from IC chips 104 to a larger cooling system, such as an immersion cooling system, thereby maintaining operating temperatures and ensuring the performance, reliability, and longevity of the IC chips 104.

In some examples, the structure of the boilerplate 108 can be a flat or contoured sheet of metal to ensure thermal contact with a heat-generating component. The thickness and size of the boilerplate 108 can vary depending on the application, with thicker plates used in scenarios requiring greater heat dissipation. The surface finish of the boilerplate 108 can be tailored to suit specific application requirements. In some examples, the surface finish of a surface of the boilerplate that faces the IC chips 104 can be processed or smoothened, for example by using electropolishing or anodization, to improve heat transfer from the TIM 106 to the boilerplate 108. In some implementations in which immersion cooling is used for the electronic device 100, and in which the IC chips 104 and the boilerplate 108 are submerged in a cooling fluid, the surface roughness of a surface of the boilerplate 108 that contacts the cooling fluid (e.g., opposite the surface of the boilerplate 108 that faces the IC chips 104) can enhance thermal transfer from the boilerplate 108 to the cooling fluid.

During operation of the device 100, the boilerplate 108 can act as a thermal bridge between the IC chips 104 and the cooling system. The boilerplate 108 provides a path for the heat generated by the IC chips 104 to be conducted away from the IC chips 104, mitigating risks of reduced performance and/or potential chip failure due to overheating. In some implementations, the boilerplate 108 is integrated with additional cooling mechanisms, such as heat sinks, to further enhance heat dissipation. As described previously, in liquid cooling solutions like immersion cooling systems, the boilerplate 108 is submerged, along with the coupled PCB 102 with IC chips 104, in a dielectric fluid that boils upon contact with the plate, carrying heat away through the phase change of the fluid.

In some implementations, the gaskets 110 are placed between the PCB 102 and the boilerplate 108 and are used as a protective barrier to prevent the TIM 106 from being displaced or washed away, e.g., in environments where the TIM 106 is exposed to mechanical stresses or fluid dynamics, such as in immersion cooling systems. The gaskets 110 can maintain the integrity and effectiveness of the TIM 106, which ensures consistent thermal conductivity between the IC chips 104 and the boilerplate 108.

The gasket 110 can be made from a compliant and durable material that can withstand the operating conditions of the electronic device 100, or the immersion cooling system, or both. In some examples, the material of the gaskets 110 can include silicone, rubber, or other elastomeric compounds.

In some implementations, the gaskets 110 are placed around the perimeter of the area where the TIM 106 is applied, for example encircling the edges of the IC chips 104. The dimensions and shape of the gaskets 110 can be customized to match the layout of the IC chips 104 and the boilerplate 108, ensuring that the TIM 106 remains confined within the targeted surface area of the IC chips 104, and that TIM 106 is not exposed to external forces (e.g., fluid agitation in immersion cooling systems) that could cause it to migrate or degrade.

In some implementations, a plurality of gaskets 110 are arranged in parallel to one another, and the IC chips 104 are situated in the spaces between pairs of parallel gaskets 110. In such implementations, the gaskets 110 do not completely encircle the IC chips 104 but instead provide support and protection in a linear arrangement. The gaskets 110 can act as a physical barrier that prevents the cooling fluid or other cooling medium in the immersion cooling system from directly impacting the TIM 106, which could otherwise cause the TIM 106 to displace or erode over time. In doing so, the gaskets 110 help to maintain the position and integrity of the TIM 106, enhancing continuous and effective thermal conductivity between the heat-generating components and the cooling system. In this manner, the configuration of the gaskets 110 can reduce the likelihood of the TIM 106 being washed away or eroded by fluid dynamics, such as in immersion cooling or forced-air cooling systems where liquids or gases are present.

In some implementations, in addition to protecting the TIM 106 as described above, the gaskets 110 can also help reduce fluid agitation and turbulence in the area immediately surrounding the TIM 106. This reduction in fluid movement further decreases the risk of the TIM 106 displacement and enhances the overall thermal stability of the system. The gaskets 110' ability to create a sealed environment around the TIM 106 is useful in applications where maintaining consistent thermal performance is essential, such as in high-power electronics, data centers, and other heat-sensitive systems.

Figure 2C:
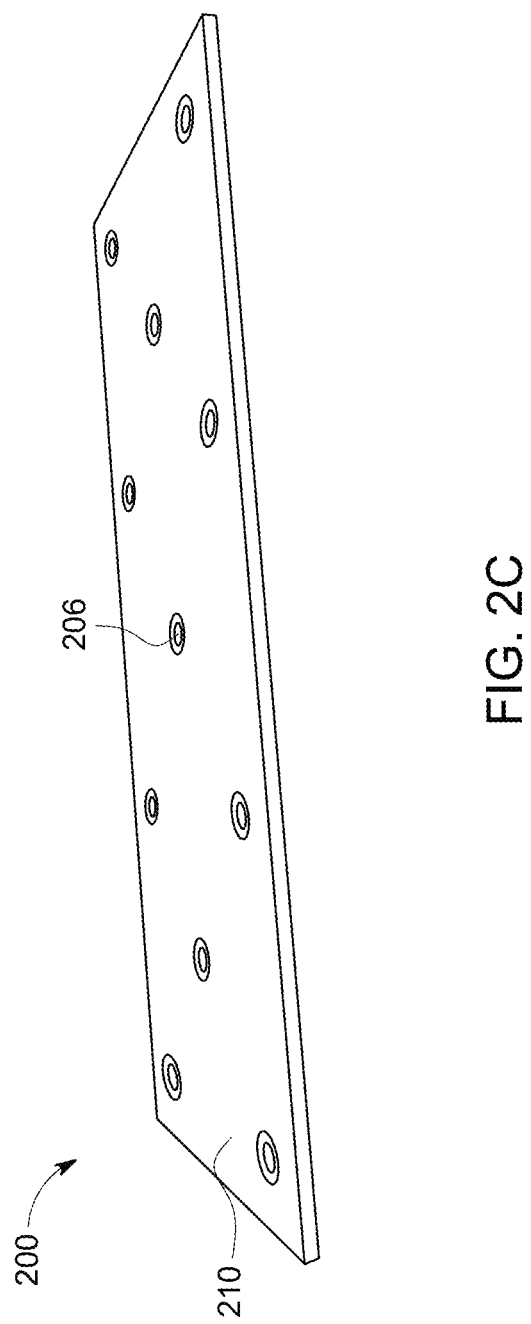

FIGS. 2A-2C illustrate perspective views of an example boilerplate 200, according to one or more implementations of the present disclosure. In some implementations, the boilerplate 200 corresponds to the boilerplate 108 of FIGS. 1A and 1B. Accordingly, some descriptions of the boilerplate 200, which have been described previously with respect to boilerplate 108, are not repeated here for brevity.

As illustrated in FIG. 2A, the boilerplate 200 includes a plurality of grooves 202 and a plurality of rails 204 located on a first surface 201 of the boilerplate 200. In some implementations, the grooves 202 are configured to accommodate gaskets, such as the gaskets 110 in FIGS. 1A and 1B. In some implementations, the rails 204 are configured to contact a heat source, such as the IC chips 104 in FIG. 1A, facilitating heat transfer from the heat source to the boilerplate 200. In the shown example, the grooves 202 and the rails 204 are arranged in parallel with each other. This parallel configuration is provided for illustrative purposes; other configurations are also possible. For example, the grooves 202 and the rails 204 can be configured in any suitable arrangement based on specific system requirements, such as diagonal, perpendicular, or even non-linear patterns, depending on the desired thermal management and mechanical stability.

In some implementations, the grooves 202 and rails 204 are arranged in an alternating pattern. For example, as shown in FIG. 2A, each rail 204 is placed between two grooves 202, and conversely, each groove 202 (except for the two grooves at the edges of the boilerplate 200) is placed between two rails 204. This alternating configuration can provide enhanced mechanical stability and even distribution of thermal contact points, for example, in applications where uniform heat dissipation across the IC chips is needed. The alternating arrangement can also help to prevent potential movement or displacement of the IC chips during operation, particularly in high-vibration environments or systems subjected to thermal cycling.

The width of the grooves 202 can vary based on the specific application or system requirements. For example, in some implementations, all grooves 202 can have the same width to provide uniform gasket placement and consistent protection for the TIM. In some implementations, the grooves 202 may have varying widths to accommodate different sizes of gaskets or to optimize the placement of the gaskets in relation to the IC chips. In some examples, one or more of the grooves 202 can be wider than the other grooves 202, which can be beneficial in applications where additional gasket material is needed in the central region to account for higher thermal loads or to ensure a more robust seal in that area.

The width of the rails 204 can vary depending on the specific application or system requirements. For example, the width of the rails 204 may be determined by the size of the heat source, such as the IC chips 104, that will be in contact with the rails 204. In some examples, wider rails 204 might be used to provide a larger surface area for heat transfer, particularly when dealing with larger IC chips that generate significant amounts of heat. Conversely, narrower rails 204 could be employed in systems where space is limited or where precision in thermal contact is required. In some examples, the width of the rails 204 can be customized to match the specific thermal profile of the IC chips, ensuring optimal heat dissipation and mechanical support for each IC chip in the system.

The boilerplate 200 further includes through holes 206, which are placed within the grooves 202 and extend through the thickness of the boilerplate 200. In the example of FIGS. 2A-2C, the through holes 206 penetrate the boilerplate 200 from the first surface 201 to the second surface 210. In some examples, the first surface 201 is a surface of the boilerplate 200 that faces the IC chips and is designed to facilitate thermal transfer by being in close contact with the TIM and the IC chips. The second surface 210 is a surface of the boilerplate 200 that is oriented towards a cooling medium, such as a cooling liquid in an immersion cooling system.

In some implementations, the inclusion of the through holes 206 allows for the use of spring-loaded screws or similar fasteners to securely attach the boilerplate 200 to a supporting structure where the IC chips are located, such as the PCB 102 in FIGS. 1A and 1B. This secure attachment can maintain the stability of the thermal interface, particularly in applications that involve mechanical stress or movement.

The arrangement of the through holes 206 within the grooves 202 is designed with intervals, which can vary depending on the requirements of the application or system. For example, the intervals between the through holes 206 in different grooves 202 can be uniform, providing consistent mechanical support across the entire surface of the boilerplate 200. This uniform spacing can be useful in systems where even pressure distribution is important for maintaining effective thermal contact between the boilerplate 200 and the IC chips.

In some examples, the intervals of the through holes 206 can be varied between different grooves 202 to accommodate specific design considerations or to improve the mechanical attachment for particular thermal or structural needs. For example, closer intervals might be used in areas where additional support is needed, such as near the edges of the boilerplate 200 or around larger IC chips, while wider intervals might be sufficient in areas with lower thermal or mechanical demands. This flexibility in the placement and spacing of the through holes 206 allows for the boilerplate 200 to be customized to a wide range of applications, ensuring that it can meet requirements of various systems and operating environments.

Figure 3A:
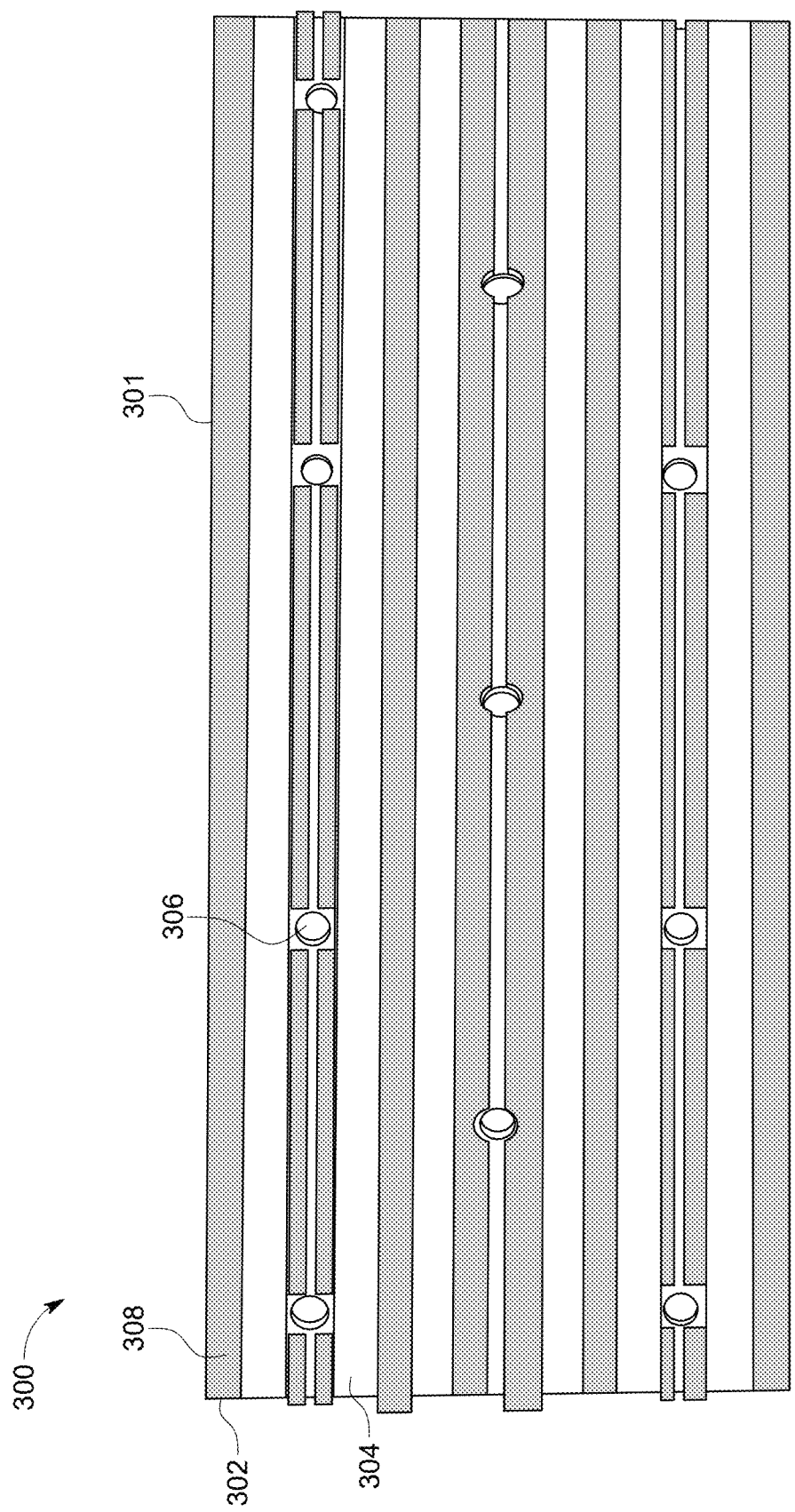
FIGS. 3A and 3B illustrate an example assembly including a boilerplate and gaskets, according to one or more implementations of the present disclosure.
Figure 3B:
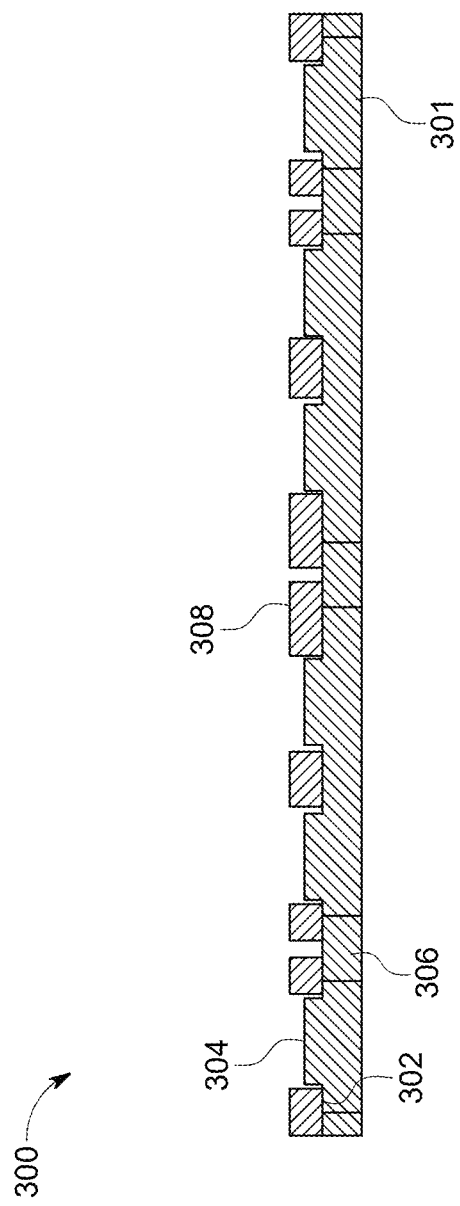

FIGS. 3A and 3B illustrate an example assembly 300 including a boilerplate 301 and gaskets 308, according to one or more implementations of the present disclosure. FIG. 3A provides a top view of the assembly 300, and FIG. 3B provides a side view of the assembly 300. In some implementations, the boilerplate 301 corresponds to the boilerplate 108 and/or 200, and the gaskets 308 correspond to the gaskets 110. Accordingly, some descriptions of the boilerplate 301 and the gaskets 308 are omitted here for brevity.

As shown, the boilerplate 301 includes a plurality of grooves 302 and a plurality of rails 304, which are aligned in parallel with each other. The grooves 302 and the rails 304 are arranged in an alternating pattern, with each groove 302 configured to accommodate one or more gaskets 308. The design of the gaskets 308 can vary depending on the specific groove 302 in which they are placed. For example, in wider grooves 302, the gaskets 308 can consist of multiple stripes to provide enhanced protection and stability, while in narrower grooves 302, a single stripe of gasket 308 can be sufficient. In the shown example of FIGS. 3A and 3B, some grooves 302 contain a single stripe of gasket 308, while others grooves 302 include multiple stripes.

In some implementations, one or more of the grooves 302 include through holes 306. In grooves 302 that incorporate through holes 306, the gaskets 308 can be arranged to avoid covering the through holes 306. This can ensure that the through holes 306 remain unobstructed, allowing for secure fastening of the boilerplate 301 to a supporting structure or other components. In the shown example, the gaskets 308 within one or more of the grooves 302 that incorporate through holes 306 are disconnected at the locations of the through holes 306, maintaining the integrity of the fastening system while still providing adequate thermal protection.

In some implementations, even in grooves 302 that do not contain through holes 306, the gaskets 308 can be disconnected at certain points along the grooves 302. This discontinuity can be employed to accommodate specific design requirements, such as allowing for differential expansion of materials under thermal stress or to facilitate the passage of other mechanical or electronic elements through the boilerplate 301. This flexibility in gasket design and placement can improve the versatility of the assembly 300, enabling it to be tailored to meet a wide range of system requirements and operational conditions.

Figure 4A:
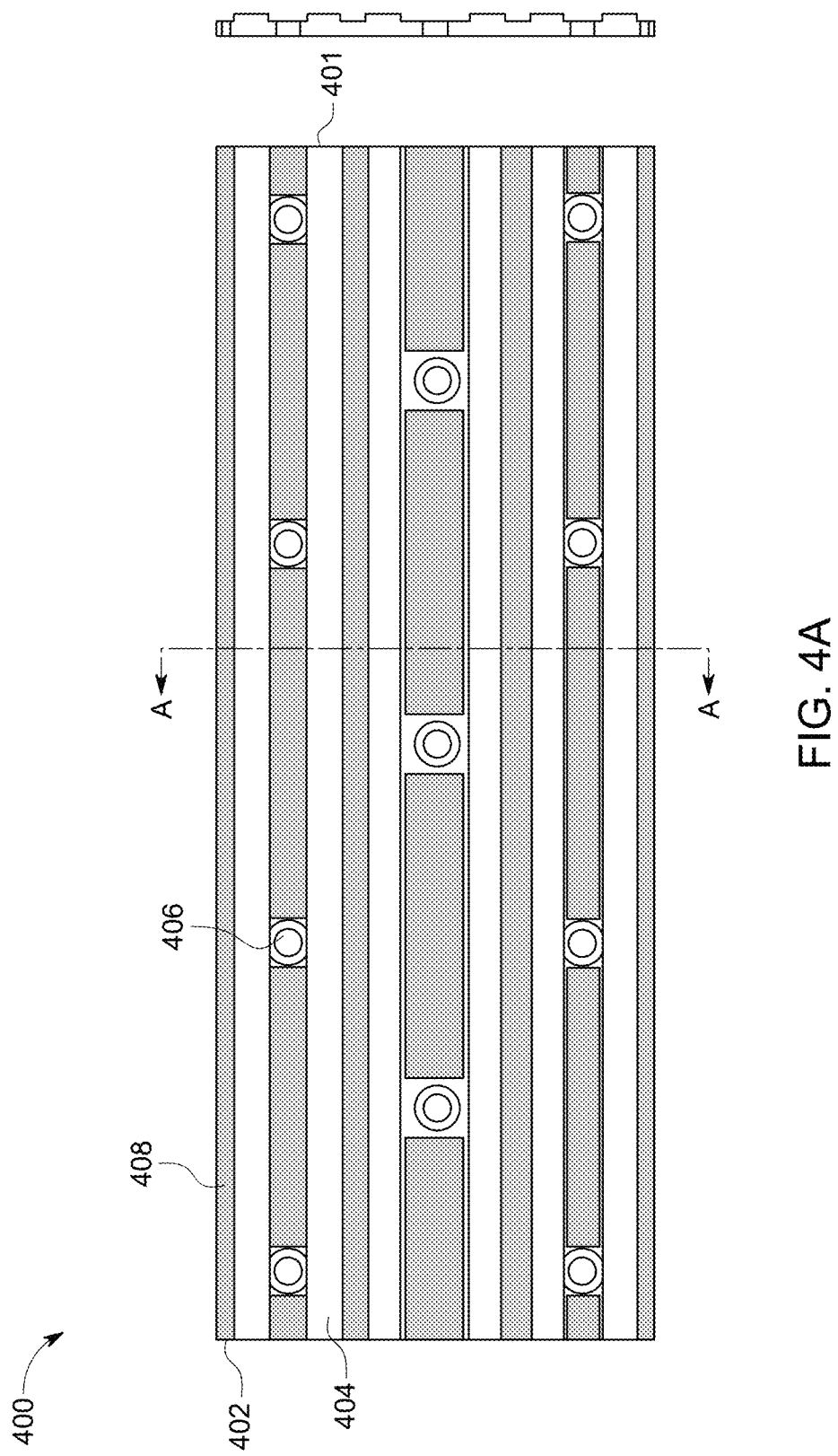
FIGS. 4A and 4B illustrate another example assembly including a boilerplate and gaskets, according to one or more implementations of the present disclosure.
Figure 4B:
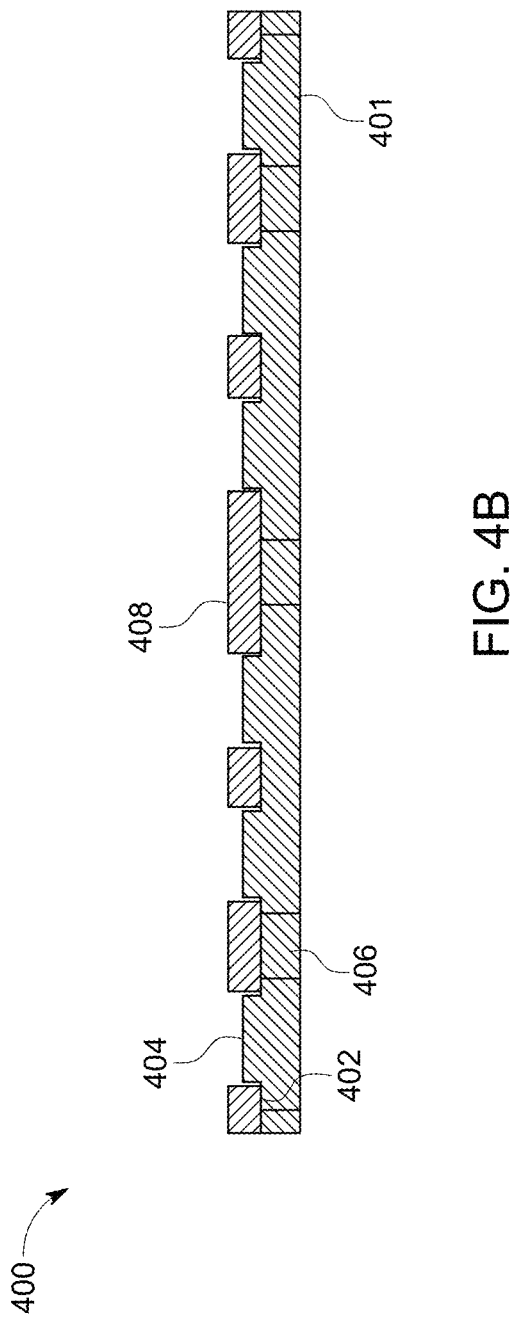

FIGS. 4A and 4B illustrate an example assembly 400 including a boilerplate 401 and gaskets 408, according to one or more implementations of the present disclosure. FIG. 4A provides a top view of the assembly 400, and FIG. 4B provides a side view of the assembly 400. In some implementations, the assembly 400 is similar to the assembly 300 of FIGS. 3A and 3B, with the primary difference being the configuration of the gaskets 408. Accordingly, some descriptions of the assembly 400 are omitted here for brevity.

As shown, the boilerplate 401 includes a plurality of grooves 402 and a plurality of rails 404, which are arranged in parallel with each other. The grooves 402 and the rails 404 alternate in a structured pattern, with each groove 402 configured to accommodate one or more gaskets 408. The configuration of the gaskets 408 can vary depending on the specific groove 402 where they are placed, allowing the assembly 400 to adapt to different thermal management and mechanical stability needs. In the shown example, some grooves 402 contain a wider stripe of gasket 408, specifically configured to fit the dimensions of a wider groove 402, ensuring contact and protection. Conversely, other grooves 402 contain a narrower stripe of gasket 408, configured to fit narrower grooves 402. This variability in gasket design and placement improves the adaptability of the assembly 400, enabling it to meet diverse operational requirements while maintaining consistent thermal performance.

Figure 5:
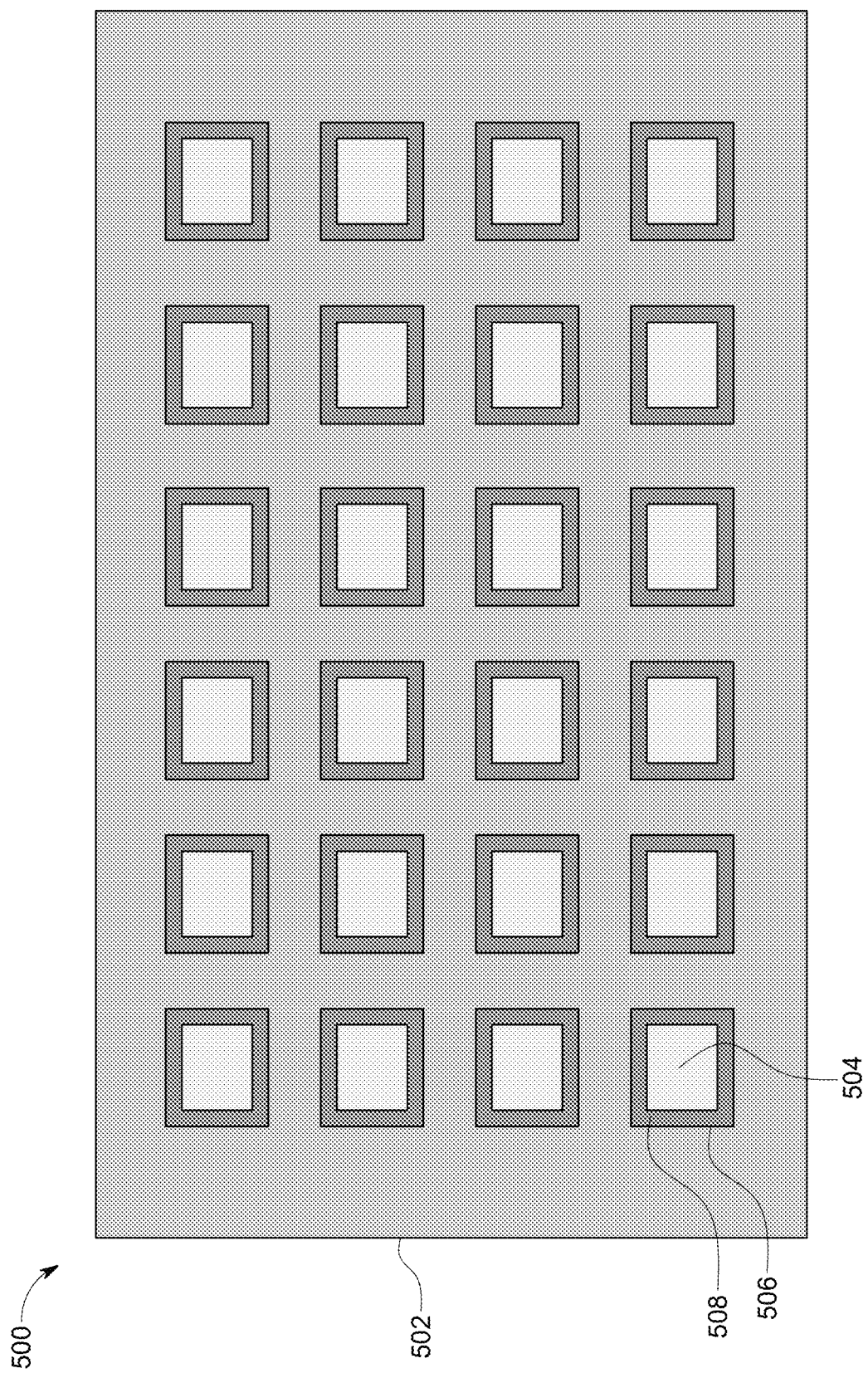
FIG. 5 illustrates an example assembly, according to one or more implementations of the present disclosure.
Figure 6:
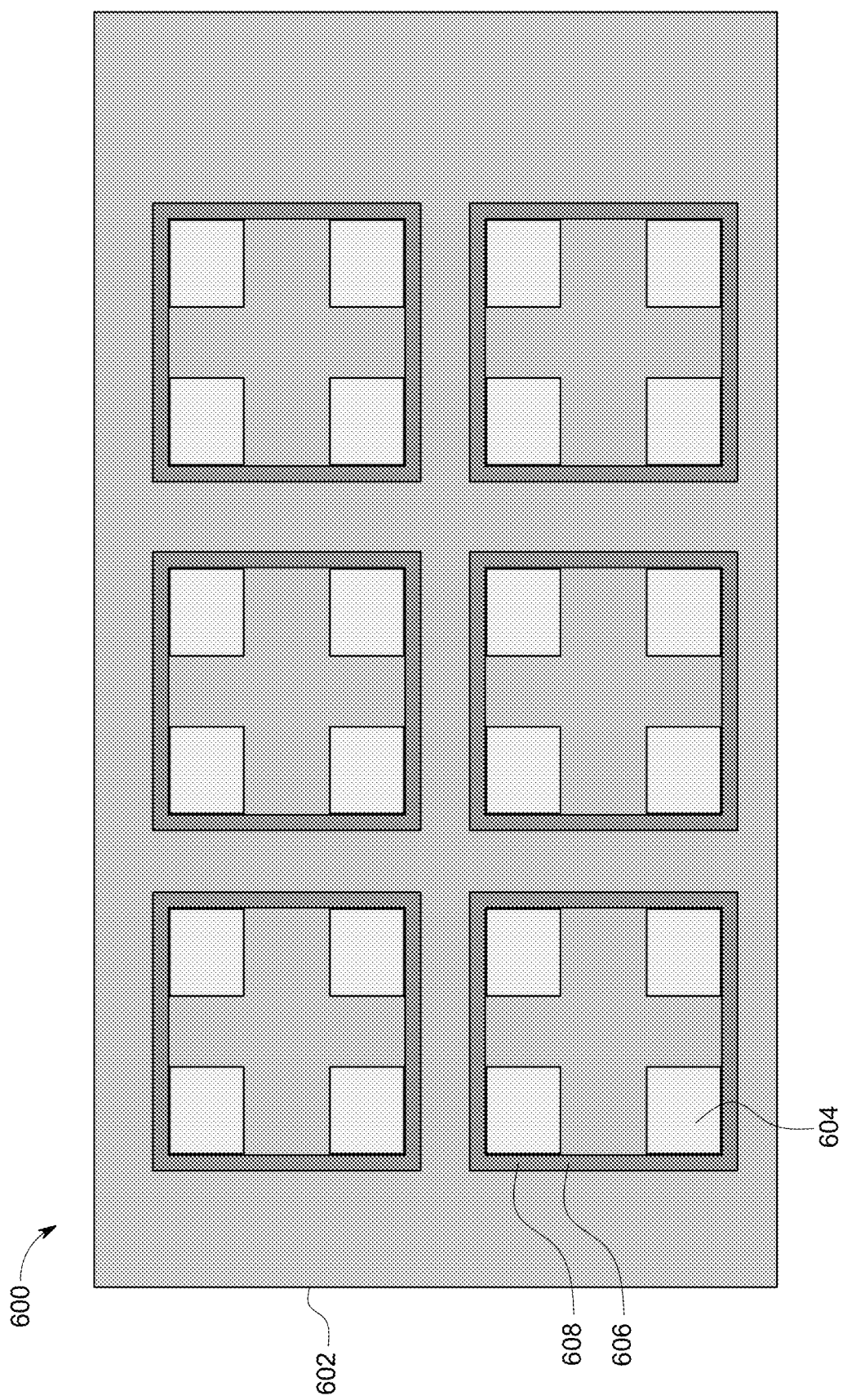
FIG. 6 illustrates another example assembly, according to one or more implementations of the present disclosure.
Figure 7:
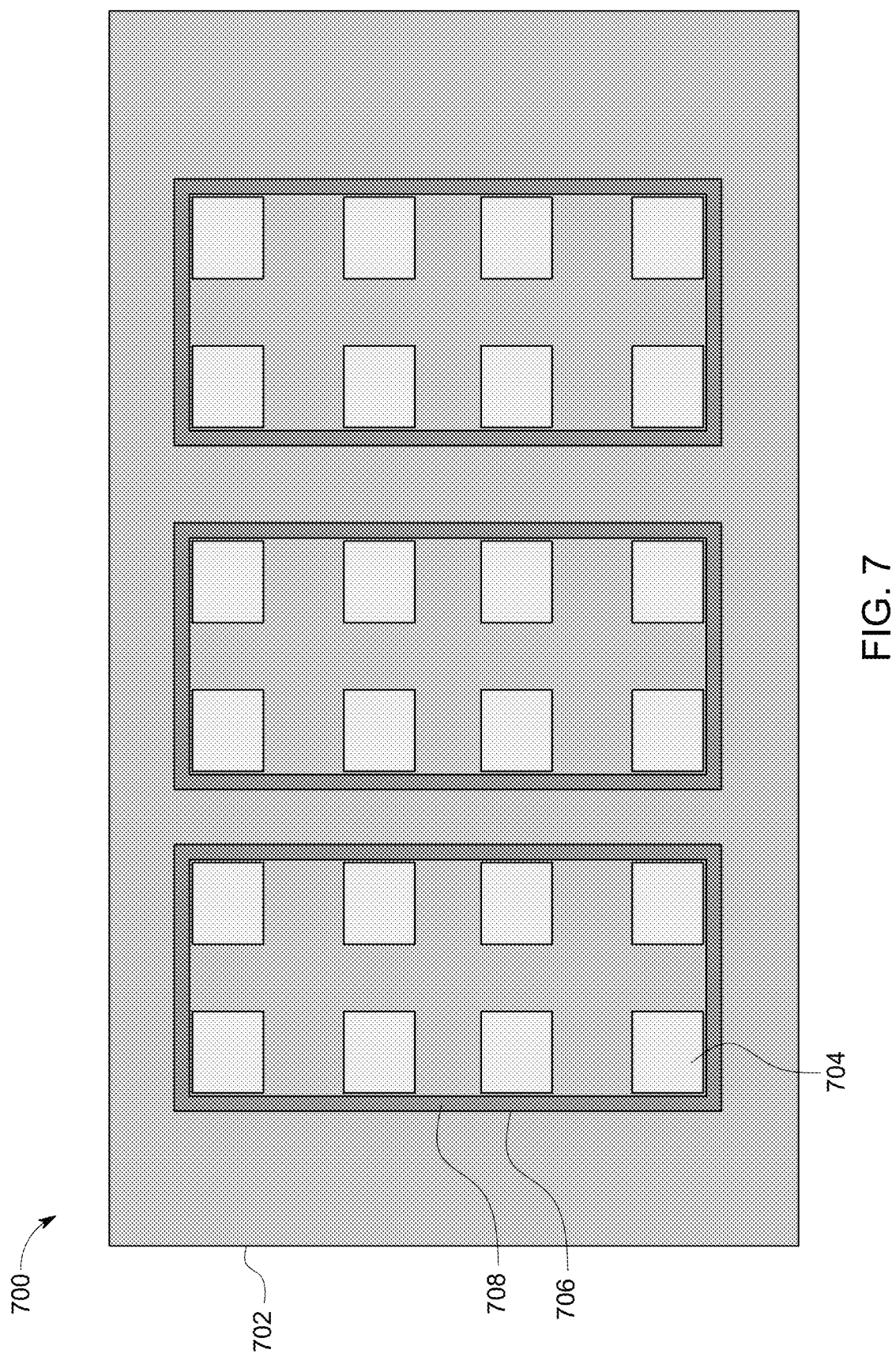
FIG. 7 illustrates another example assembly, according to one or more implementations of the present disclosure.

FIGS. 5-7 illustrate example assemblies 500, 600 and 700, according to one or more implementations of the present disclosure.

The assembly 500 in FIG. 5 includes a boilerplate 502. The boilerplate 502 includes a plurality of grooves 506, each having a rectangular configuration. The grooves 506 are configured to accommodate corresponding gaskets 508, which also adopt a rectangular shape to fit within the grooves 506. The grooves 506 create isolated areas on the surface of the boilerplate 502, with each isolated area forming a discrete section. The isolated sections encircled by the gaskets 508 serve as designated regions for thermal management, where each section can be configured to be in direct contact with an IC chip 504. This configuration ensures that each IC chip 504 is effectively isolated and thermally managed, reducing the risk of thermal interference between adjacent components.

In some implementations, the rectangular grooves 506 and corresponding gaskets 508 can vary in size to accommodate different design requirements. For example, smaller grooves may be used for single IC chips, while larger grooves could be employed in applications requiring the isolation of multiple IC chips on a single section. This flexibility allows the assembly 500 to be tailored to various electronic systems, providing optimal thermal isolation and management based on specific operational needs.

The assembly 600 in FIG. 6 is similar to the assembly 500 but differs in the size and configuration of the isolated areas on the boilerplate 602. In assembly 600, each groove 606 of the boilerplate 602 is configured to isolate a larger area, forming a section that is larger than a section in FIG. 5. In this configuration, each section is sufficiently large to accommodate up to four IC chips 604. Accordingly, the gaskets 608 that fit into the respective grooves 606 are also configured to seal and isolate these larger areas, ensuring that the thermal management of multiple IC chips 604 on a single section is handled efficiently. This configuration can be useful in applications where multiple IC chips need to be thermally managed together while still being isolated from other regions of the boilerplate.

In some examples, the sections isolated by the grooves can be configured to accommodate different numbers of IC chips, depending on the specific requirements of the application. For example, a section isolated by a groove may be configured to hold three IC chips, with the corresponding grooves and gaskets adjusted accordingly. This adaptability makes the assembly 600 a versatile solution for complex electronic systems that require effective thermal management across multiple components.

Similarly, the assembly 700 in FIG. 7 further expands the size of the isolated areas on the boilerplate 702. In the shown example, each groove 706 is designed to create an even larger section on the boilerplate 702, with each section being large enough to accommodate up to eight IC chips 704. The corresponding gaskets 708 are configured to seal and isolate these extensive areas, ensuring that all eight IC chips 704 on each section are thermally managed as a unit while remaining isolated from other areas of the boilerplate 702.

The configuration of assembly 700 can be useful for high-density applications where multiple IC chips must be managed together but still require some degree of thermal isolation to prevent overheating or cross-talk between adjacent components. The flexibility in the size of the sections and the number of IC chips that each section can accommodate makes the assembly 700 particularly suitable for advanced computing or data processing systems where thermal management is needed to maintain performance and reliability.

The configurations of the assemblies 500, 600, and 700 are not exhaustive, and the design of the grooves, gaskets, and sections can be adapted or modified to meet specific application requirements. Variations in the size, shape, and arrangement of these elements can be implemented without departing from the scope of the invention, allowing for a wide range of customization to improve thermal management and mechanical stability in various electronic systems.

Figure 8:
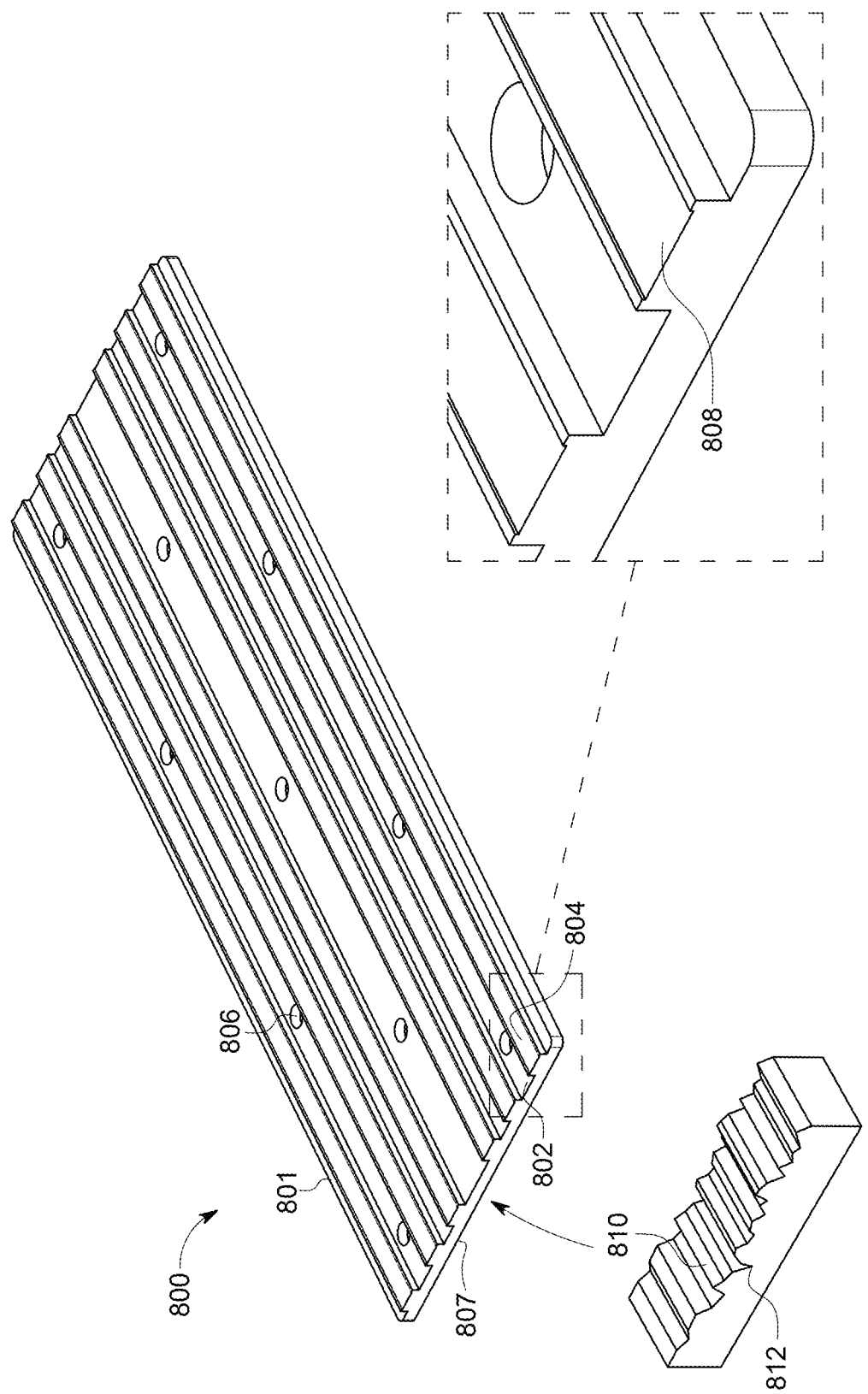
FIG. 8 illustrates an example boilerplate, according to one or more implementations of the present disclosure.

FIG. 8 illustrates an example boilerplate 800, according to one or more implementations of the present disclosure. In some implementations, the boilerplate 800 and/or one or more elements of the boilerplate 800 are similar to those described with respect to FIGS. 1A-7. Accordingly, some descriptions of the analogous elements are omitted here for brevity.

As illustrated in FIG. 8, the boilerplate 800 includes a plurality of grooves 802 and a plurality of rails 804 located on a first surface 801 of the boilerplate 800. In some implementations, the grooves 802 are configured to accommodate gaskets, such as the gaskets 110 in FIGS. 1A and 1B. In some implementations, the rails 804 are configured to contact a heat source, such as the IC chips 104 in FIG. 1A, facilitating heat transfer from the heat source to the boilerplate 200. In the shown example, the grooves 802 and the rails 804 are arranged in parallel with each other. It is important to note that this parallel configuration is provided for illustrative purposes. The grooves 802 and the rails 804 can be configured in any suitable arrangement based on specific system requirements, such as diagonal, perpendicular, or even non-linear patterns, depending on the desired thermal management and mechanical stability.

In some implementations, the grooves 802 and rails 804 are arranged in an alternating pattern. For example, as shown in FIG. 8, each rail 804 is placed between two grooves 802, and conversely, each groove 802, except for the two grooves at the edges of the boilerplate 800, is placed between two rails 804. This alternating configuration can provide enhanced mechanical stability and even distribution of thermal contact points, for example in applications where uniform heat dissipation across the IC chips is needed. The alternating arrangement can also help to prevent potential shifting of the IC chips during operation, particularly in high-vibration environments or systems subjected to thermal cycling.

The width of the grooves 802 can vary based on the specific application or system requirements. For example, in some implementations, all grooves 802 can have the same width to provide uniform gasket placement and consistent protection for the TIM. In some implementations, the grooves 802 may have varying widths to accommodate different sizes of gaskets or to optimize the placement of the gaskets in relation to the IC chips. In the example of FIG. 8, the central groove 802 is wider than the other grooves 802, which can be beneficial in applications where additional gasket material is needed in the central region to account for higher thermal loads or to ensure a more robust seal in that area.

The width of the rails 804 can vary depending on the specific application or system requirements. For example, the width of the rails 804 may be determined by the size of the heat source, such as the IC chips 104, that will be in contact with the rails 804. In some examples, wider rails 804 might be used to provide a larger surface area for heat transfer, particularly when dealing with larger IC chips that generate significant amounts of heat. Conversely, narrower rails 804 could be employed in systems where space is limited or where precision in thermal contact is required. In some examples, the width of the rails 804 can be customized to match the specific thermal profile of the IC chips, ensuring optimal heat dissipation and mechanical support for each IC chip in the system.

The boilerplate 800 further includes through holes 806, which are placed within the grooves 802 and extend through the entire thickness of the boilerplate 800. In the example of FIG. 8, the through holes 806 penetrate the boilerplate 800 from the first surface 801 to the second surface 807. In some examples, the first surface 801 is a surface of the boilerplate 800 that faces the IC chips and is designed to facilitate thermal transfer by being in close contact with the TIM and the IC chips. The second surface 807 is a surface of the boilerplate 800 that is oriented towards a cooling medium, such as a cooling liquid in an immersion cooling system. In some implementations, the second surface 807 is similar to the surface 210.

In some implementations, the inclusion of the through holes 806 allows for the use of spring-loaded screws or similar fasteners to securely attach the boilerplate 800 to a supporting structure where the IC chips are located, such as the PCB 102 in FIGS. 1A and 1B. This secure attachment can maintain the stability of the thermal interface, particularly in applications that involve mechanical stress or movement.

The arrangement of the through holes 806 within the grooves 802 is designed with specific intervals, which can vary depending on the requirements of the application or system. For example, the intervals between the through holes 806 in different grooves 802 can be uniform, providing consistent mechanical support across the entire surface of the boilerplate 800. This uniform spacing can be useful in systems where even pressure distribution is important for maintaining effective thermal contact between the boilerplate 800 and the IC chips.

In some examples, the intervals of the through holes 806 can be varied between different grooves 802 to accommodate specific design considerations or to improve the mechanical attachment for particular thermal or structural needs. For example, closer intervals might be used in areas where additional support is needed, such as near the edges of the boilerplate 800 or around larger IC chips, while wider intervals might be sufficient in areas with lower thermal or mechanical demands. This flexibility in the placement and spacing of the through holes 806 allows for the boilerplate 800 to be customized to a wide range of applications, ensuring that it can meet the specific requirements of various systems and operating environments.

In some implementations, at least one of the rails 804 comprises a recess in a surface of the at least one rail 804 that faces the IC chips. This design can improve the interface between the rail 804 and the IC chips by providing a dedicated space for TIM application. In the example of FIG. 8, the rail 804 includes a recess 808 located on the surface of the rail 804 that faces the IC chips. The recess 808 is configured as a rectangular cavity with a depth sufficient to accommodate the thickness of a TIM, ensuring that the TIM can fully engage the contact area between the rail 804 and the IC chips. In some examples, the width of the cavity can be slightly larger than the footprint of the IC chips, allowing the TIM to cover the entire interface area while leaving enough space to prevent overflow beyond the recess.

As illustrated, the recess 808 is bounded by outer walls, which rise perpendicularly from the base of the cavity to a height that provides enough containment for the TIM, ensuring it remains confined within the designated area. In some examples, these walls can be sized relative to the thickness of the TIM, preventing it from spreading beyond the intended area while also allowing for minor thermal expansion or contraction during operation.

The dimensions of the recess 808, including its depth, width, and wall height, can be proportioned in relation to the size and properties of the TIM, improving the thermal contact and mechanical stability of the interface between the IC chips and the rail 804.

In some implementations, the second surface 807 of the boilerplate 800 is configured with a roughness exceeding a predetermined threshold to enhance thermal performance. The roughness of the second surface 807 can influences the efficiency of heat transfer between the boilerplate 800 and a cooling medium, such as a cooling fluid. In some examples, the roughness of the second surface 807 is within a range of 1.7 to 2.3 micrometers, specified to balance the surface area with thermal contact resistance. In some implementations, the roughness of the second surface 807 includes a plurality of ridges 810 and intervening valleys 812, which together create a textured surface that can increase the available surface area for heat exchange. The ridges and valleys can increase the number of contact points between the boilerplate 800 and the cooling fluid, promoting more effective heat dissipation.

In some implementations, the roughness of the second surface 807 is achieved through processing techniques such as sand blasting or bead blasting. These methods can be used to create uniform micro-irregularities across the surface, which serve as nucleation sites during cooling. In some examples, sand blasting can include propelling fine particles at high velocity onto the surface 807, resulting in a rough texture with a consistent pattern of ridges 810 and valleys 812. In some examples, bead blasting can include using spherical media to impart a more controlled roughness, enhancing the uniformity of the surface 812. This processing, such as sandblasting or bead blasting, not only increases the surface roughness but also improves the thermal contact between the boilerplate 800 and the cooling fluid by creating numerous microchannels where boiling and heat exchange can occur more efficiently.

In some implementations, the boilerplate 800 includes a thermally conductive metal. Examples of suitable materials of the boilerplate include copper and aluminum. The boilerplate 800 can be used to facilitate the transfer of heat from a heat source, such as the IC chips 104, to a larger cooling system, such as an immersion cooling system. The boilerplate 108 can act as a thermal bridge between the IC chips and the cooling system. The IC chips can generate heat due to electrical activity. If not effectively managed, this heat can lead to overheating, reduced performance, and potential failure of the component. The boilerplate 800 provides a path for this heat to be conducted away from the IC chips, mitigating these risks. In some implementations, the boilerplate 800 is integrated with additional cooling mechanisms, such as heat sinks, to further enhance heat dissipation. In liquid cooling solutions like immersion cooling systems, the boilerplate 800 can be submerged in a dielectric fluid that boils upon contact with the plate, carrying heat away through the phase change of the liquid.

The increased roughness of the second surface 807 of the boilerplate 800 can improve heat transfer efficiency. The roughened surface, achieved through methods like bead blasting, introduces micro-irregularities that create additional nucleation sites. These sites are important for initiating the boiling process in the cooling fluid, which in turn increases the rate of heat transfer. The rough texture also promotes the generation of more bubbles within the cooling fluid, which further improves heat dissipation. By increasing the surface area available for heat exchange and increasing the interaction between the cooling fluid and the boilerplate 800, the roughened second surface 807 can contribute to the overall thermal management of the system.

Figure 9:
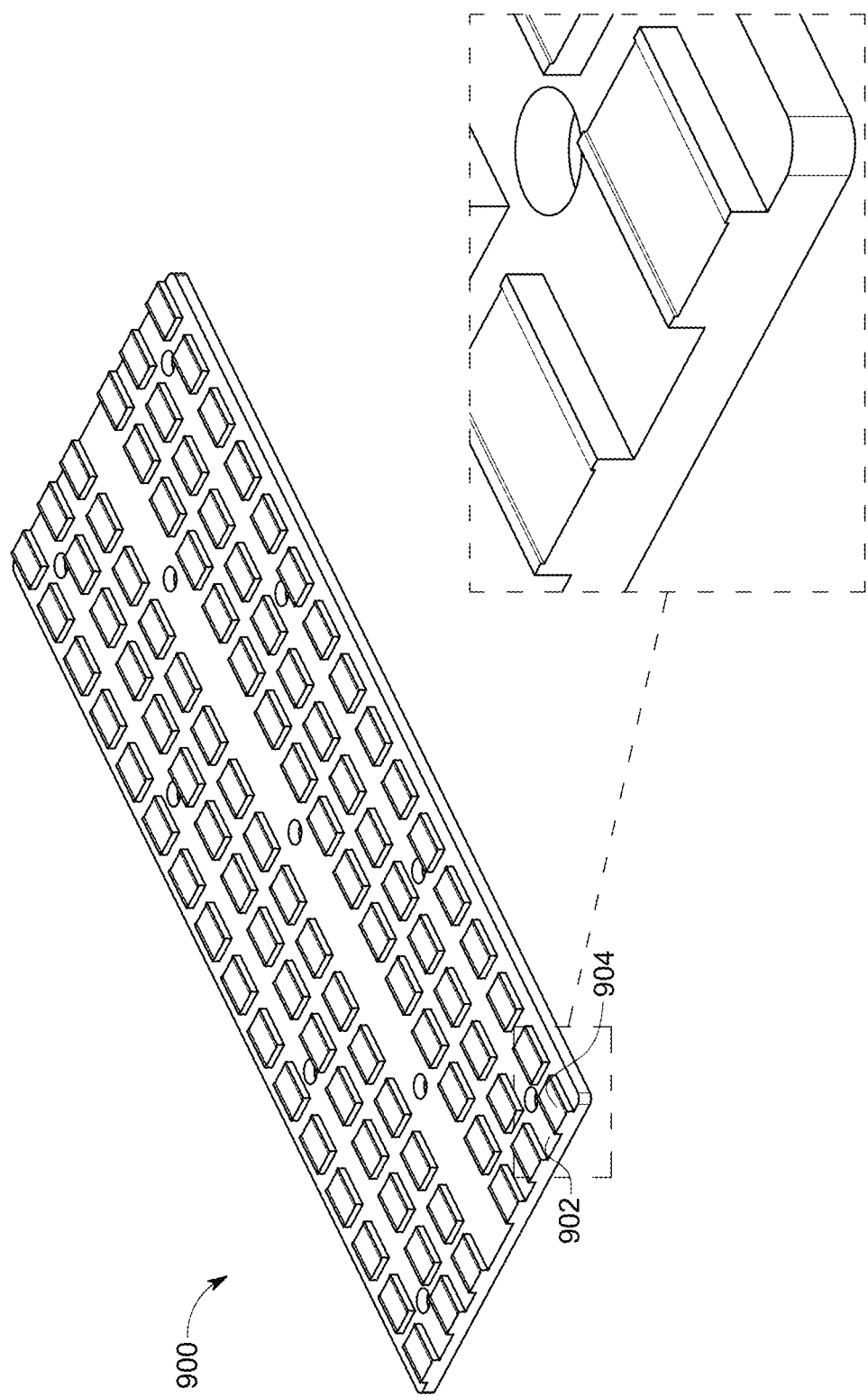
FIG. 9 illustrates another example boilerplate, according to one or more implementations of the present disclosure.

FIG. 9 illustrates an example boilerplate 900, according to one or more implementations of the present disclosure. In some implementations, the boilerplate 900 and/or one or more elements of the boilerplate 900 are similar to those described with respect to FIGS. 1A-8. Accordingly, some descriptions of the analogous elements are omitted here for brevity.

In some implementations, the boilerplate 900 is configured to improve thermal management in electronic systems by providing a structured surface that facilitates the efficient transfer of heat from a heat source, such as IC chips to a cooling medium. As shown, the boilerplate 900 includes a plurality of grooves 902 and a plurality of rails 904. In some implementations, the boilerplate 900 is similar in configuration to the boilerplate 800, with the primary difference being that one or more of the rails 904 in the boilerplate 900 are segmented into multiple sections. The segmented rails 904 are configured to accommodate various configurations of IC chips and to provide enhanced flexibility in thermal management. For brevity, descriptions of features common to both the boilerplate 900 and the boilerplate 800 are not repeated here, as they have been previously detailed.

In the example of FIG. 9, some of the rails 904 includes a plurality of sections that are separated from each other. This segmented configuration allows for more precise placement of TIM and improves the thermal coupling between the IC chips and the boilerplate 900. In some implementations, each section of the rail 904 is configured to align with an IC chip, ensuring that the TIM is applied where it is needed, without excess material spreading to areas that do not require thermal management.

In some implementations, each of the sections of a rail 904 includes a recess that is configured to house a TIM. The recess includes outer walls that form a cavity, which is dimensioned to accommodate the TIM and to maintain its position during the operation of the electronic device. The outer walls of the recess serve to contain the TIM within the cavity, preventing it from spreading or shifting, which could otherwise compromise the thermal connection between the IC chips and the boilerplate 900.

The configuration of these segmented sections and their corresponding recesses can improve the thermal interface by ensuring that the TIM remains in consistent and complete contact with both the IC chips and the rail 904. This configuration enhances the efficiency of heat transfer, reduces thermal resistance, and improves the overall performance and reliability of the electronic system. By isolating the TIM within each section, the design also mitigates potential issues related to thermal expansion and contraction, thereby maintaining the integrity of the thermal interface over time.

Figure 10:
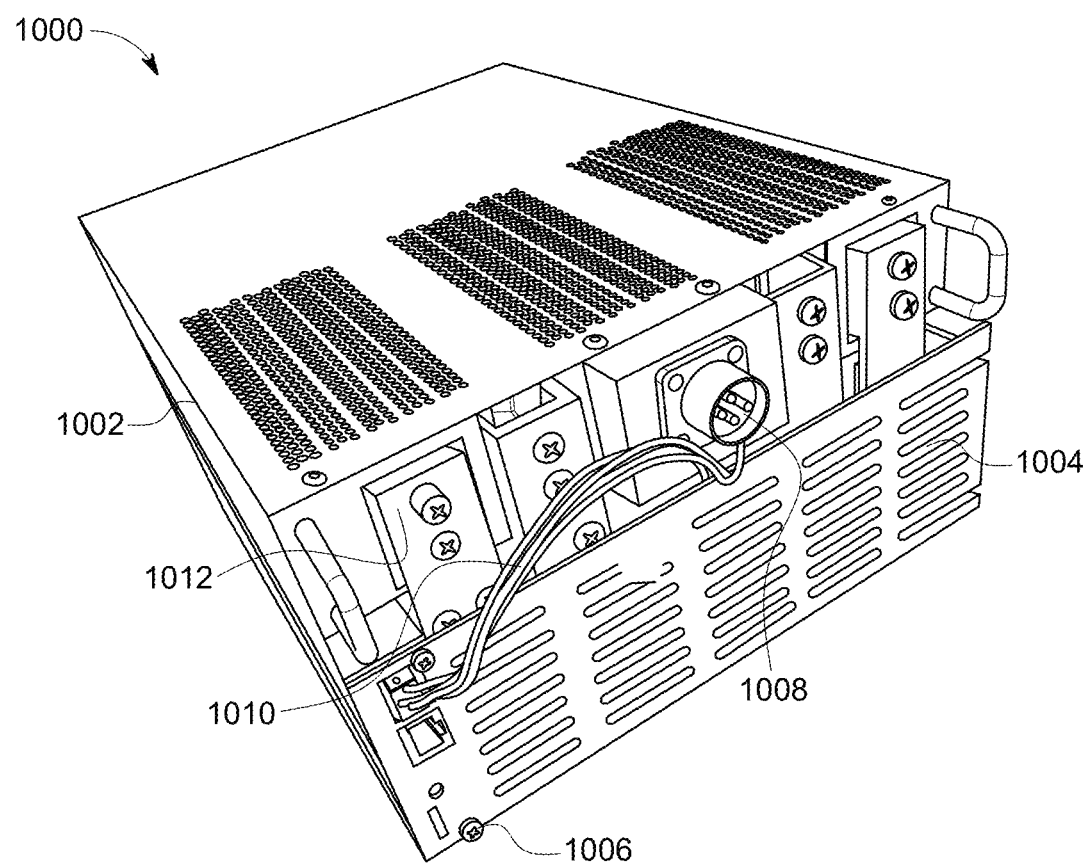
FIG. 10 illustrates an example device, according to one or more of the implementations of the present disclosure.

FIG. 10 illustrates an example device 1000, according to one or more of the implementations of the present disclosure. In some implementations, the device 1000 is configured to house and protect electronic components, such as PCBs with IC chips mounted thereon (e.g., electronic device 100) while facilitating efficient thermal management during runtime operations of the electronic components. As illustrated, the device 1000 includes a container 1002, a baffle cover 1004, screws 1006, a connector 1008, wires 1010, and couplers 1012. In some implementations, these components work together to provide both structural integrity and functionality to the device 1000, particularly in environments where immersion cooling is used.

In the example of FIG. 10, the container 1002 is configured with a cubic shape, providing a stable and compact structure for housing internal electronic components such as PCBs. In some examples, the container 1002 can be constructed with any suitable dimensions to accommodate a particular size and number of PCBs or other electronic components housed within it. In some implementations, the container 1002 is made of a metal material for its durability, electromagnetic shielding properties, and thermal conductivity. The metal construction can aid in heat dissipation, protecting the internal components from overheating during operation.

The baffle cover 1004 is placed along a surface of the device 1000, serving as a barrier and directing the flow of cooling fluid when the device 1000 is in use. The baffle cover 1004 can be secured in place using couplers such as screws 1006, which ensure a tight and stable connection. In some implementations, the device 1000 includes more than one baffle cover 1004, positioned at opposing surfaces of the device 1000, to provide enhanced fluid flow control and structural support. These baffle covers 1004 can help manage the movement of cooling fluid, reducing the likelihood of fluid stagnation and ensuring consistent thermal management across the device.

In some implementations, the device 1000 is immersed in a cooling fluid (e.g., a two-phase cooling fluid as described in the preceding sections), with the baffle cover 1004 managing fluid dynamics around the device. The baffle cover 1004 may include one or more openings that are configured to control the agitation and flow of the cooling fluid in proximity to the edges of the device 1000. The openings can be configured to manage turbulence or direct fluid flow in a way that enhances heat exchange, ensuring that the cooling fluid effectively removes heat from the device's surface. By controlling the agitation of the cooling fluid, the baffle cover 1004 helps maintain the temperature for the electronic components housed within the container 1002.

The device 1000 further includes a connector 1008. In some implementations, the connector 1008 is used to provide electrical and/or electronic connections to the PCBs housed within the container 1002. The connector 1008 facilitates the transfer of power and data between the internal components and external systems. Wires 1010 extend from the connector 1008 to the PCBs, providing an electrical connection.

The device 1000 further includes couplers 1012, which are used to hold or couple the PCBs securely within the container 1002. In some implementations, the couplers 1012 are configured to ensure that the PCBs remain firmly in place, even when the device 1000 is subjected to mechanical vibrations, thermal expansion, or other environmental stresses. The couplers 1012 can be configured as clips, brackets, or fasteners, depending on the specific design requirements of the device. In some examples, the couplers 1012 can be placed at points within the container 1002 to provide support and stability to the PCBs, preventing movement that could disrupt the electrical connections or damage the components. In some implementations, the couplers 1012 are made from a material that is both thermally and electrically insulating, helping to protect the PCBs from potential short circuits or heat-related damage.

The couplers 1012 can ensure that the PCBs are securely mounted while allowing for easy installation and removal when necessary. This modularity can be useful for maintenance, upgrades, or replacement of the PCBs, providing flexibility in managing the electronic components housed within the device 1000.

Figure 11:
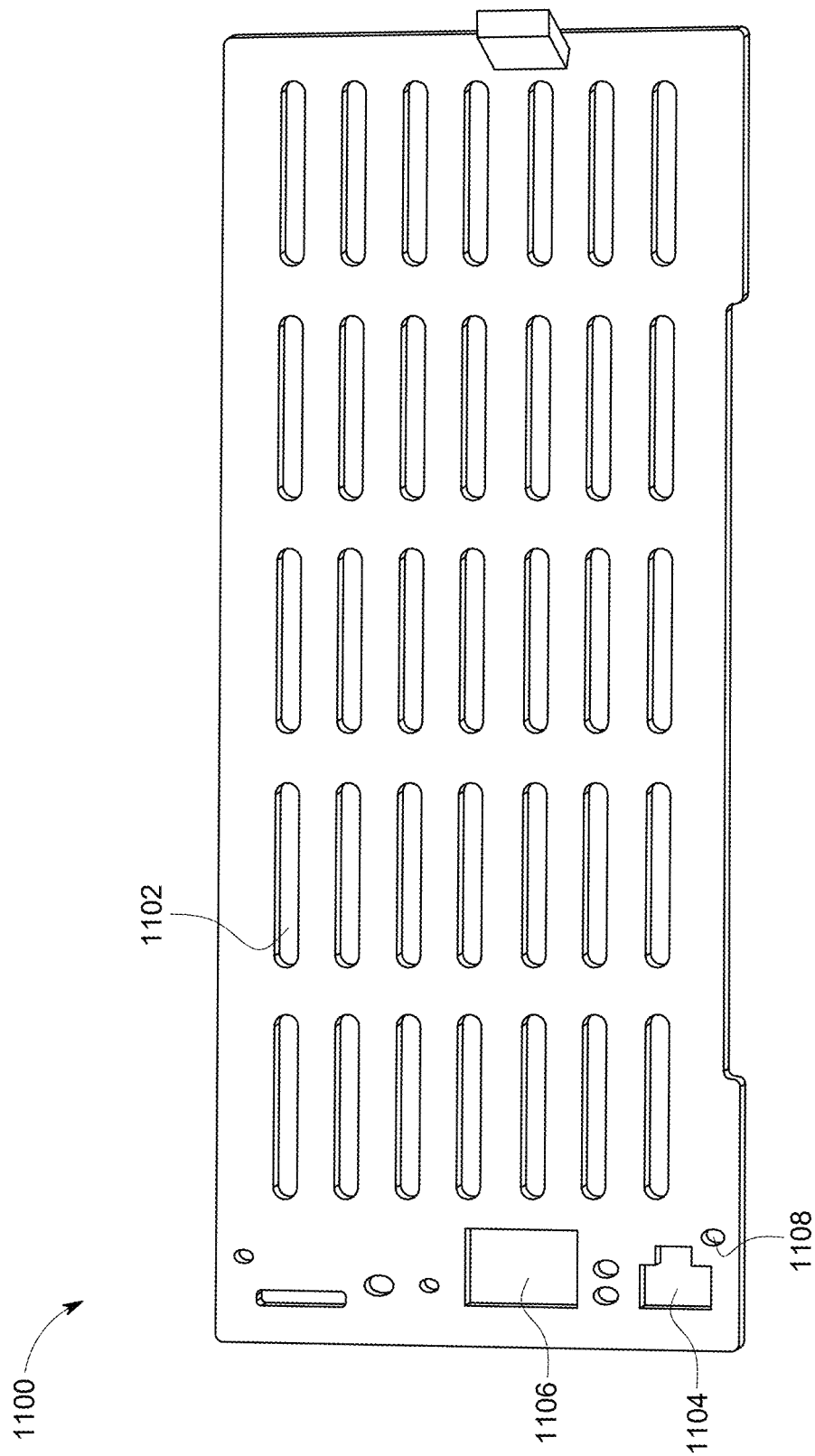
FIG. 11 illustrates an example baffle cover, according to one or more implementations of the present disclosure.

FIG. 11 illustrates an example baffle cover 1100, according to one or more implementations of the present disclosure. In some implementations, the baffle cover 1100 is configured to manage the flow of cooling fluid around and within an electronic device, providing both thermal management and structural support. In some implementations, the baffle cover 1100 can be an implementation of the baffle cover 1004 described in FIG. 10, sharing similar functions and features. In some implementations, the baffle cover 1100 can include additional design variations to accommodate different operational requirements.

In some implementations, the baffle cover 1100 includes a thermally conductive material. In some examples, the thermally conductive material can be a metal, such as aluminum or copper, which provides excellent heat transfer properties while also offering durability and corrosion resistance. The baffle cover 1100 can also be coated with a protective layer to prevent oxidation or other forms of degradation that could impair its thermal conductivity over time.

As shown, the baffle cover 1100 includes a plurality of openings 1102, which are placed to control the flow and agitation of the cooling fluid. The openings 1102 can be configured in various shapes and sizes, depending on the specific cooling requirements of the device. In some implementations, the openings 1102 can be slits, slots, or holes, each configured to direct the cooling fluid in a manner that enhances heat dissipation from the electronic components. For example, slits or elongated slots can be used to create a laminar flow, which efficiently removes heat from the surface of the baffle cover 1100, while circular holes can generate localized turbulence to enhance cooling in specific areas.

In some examples, the openings 1102 can have any suitable shape, such as circular, rectangular, or hexagonal, depending on the desired fluid dynamics and manufacturing considerations. The size and distribution of the openings 1102 can be configured to provide a balance between structural integrity and fluid flow, ensuring that the baffle cover 1100 remains robust while effectively managing the cooling fluid.

In some examples, the openings 1102 can be arranged in a uniform grid pattern across the entire surface of the baffle cover 1100. This arrangement can promote even cooling fluid distribution across the device for applications where consistent thermal management is required for all internal components.

In some examples, the openings 1102 can be arranged in concentric circles or in a radial pattern, with the center of the pattern aligned with a heat-intensive area, such as a CPU or another high-power component. This arrangement can enhance cooling efficiency in areas where heat dissipation is most needed.

In some examples, the openings 1102 can be clustered in specific regions of the baffle cover 1100, targeting areas where higher cooling fluid flow is needed. For example, clusters of openings 1102 can be placed directly above or around high-temperature components to create focused cooling zones.

In some examples, the openings 1102 can be arranged in a staggered or offset pattern, which can help to disrupt fluid flow and create turbulence, enhancing heat transfer in certain areas of the baffle cover 1100. This arrangement can be useful in applications where maximizing surface area exposure to the cooling fluid is crucial.

The baffle cover 1100 further includes a first slot 1104 and a second slot 1106, each that can be configured to accommodate different types of connections required by the electronic device. In some examples, the first slot 1104 can be used to couple electrical connections, such as power cables or signal wires, providing a secure and organized pathway for electrical connections to the internal components. In some examples, the second slot 1106 can be used to couple network connections, such as Ethernet cables or other data transmission lines. The placement and size of the slots 1104 and 1106 can be customized based on the specific layout and requirements of the device, allowing for flexible integration of various electrical and network connections.

The baffle cover 1100 also includes holes 1108, which can be used for securing the baffle cover 1100 to a container, such as the container 1002 described in FIG. 10. In some implementations, the holes 1108 are configured to accommodate screws or other fastening mechanisms, ensuring that the baffle cover 1100 is securely attached to the container. The positioning of the holes 1108 can be configured to provide even pressure distribution when the baffle cover 1100 is fastened, preventing warping or misalignment that could compromise the device's structural integrity or cooling efficiency.

In some implementations, the holes 1108 can be reinforced with metal inserts or washers to provide additional strength and durability, for example in environments subject to high mechanical stress or thermal cycling.

Figure 12:
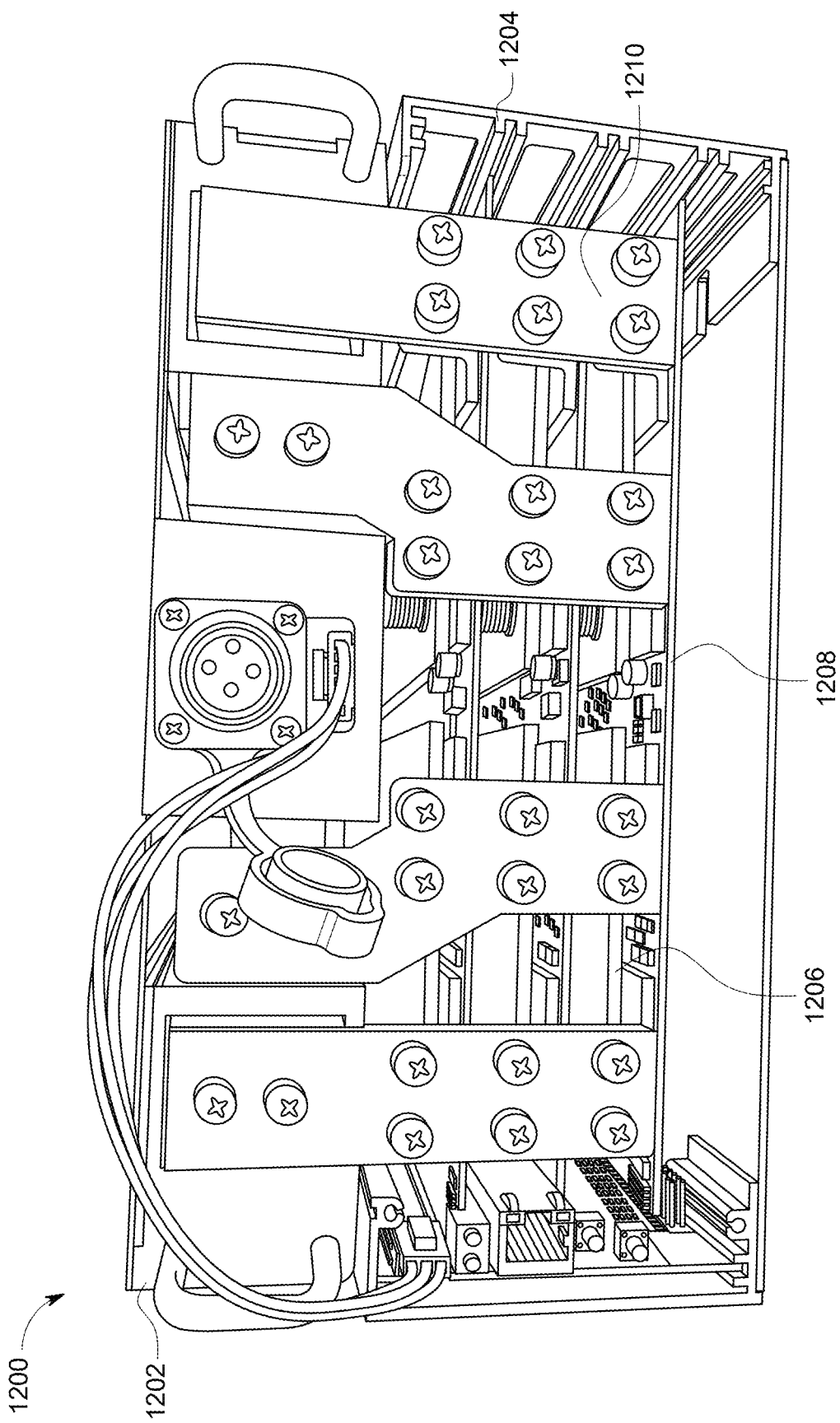
FIG. 12 illustrates another example device, according to one or more implementations of the present disclosure.

FIG. 12 illustrates an example device 1200, according to one or more implementations of the present disclosure. In some implementations, the device 1200 is similar to the device 1000 of FIG. 10, with the primary difference being that a baffle cover has been removed from the device 1200 to expose the internal components.

As shown, the device 1200 includes a container 1202, which is configured to house multiple PCBs 1208. Each PCB 1208 is coupled to one or more boilerplates 1206, which can be configured to facilitate efficient heat transfer away from the IC chips mounted on the PCBs 1208. In some implementations, a boilerplate 1206 is integrated with a corresponding PCB 1208. For example, the boilerplate 1206 and PCB 1208 can be manufactured as a single unit to enhance thermal conductivity and reduce assembly complexity. This integration can improve the overall thermal performance by minimizing the thermal resistance between the IC chips and the cooling system.

In some implementations, more than one boilerplate 1206 can be coupled to the same PCB 1208. This configuration can allow for targeted cooling of specific areas on the PCB 1208 where heat generation is most intense, such as regions with multiple IC chips or high-power components. The ability to couple multiple boilerplates 1206 to a single PCB 1208 provides flexibility in thermal management, enabling the system to handle higher thermal loads more effectively.

In some implementations, each PCB 1208 includes one or more IC chips, with a TIM coating the surfaces of the IC chips that are in contact with the boilerplate 1206. The TIM is used to improve thermal conduction between the IC chips and the boilerplate 1206, as it fills in any microscopic gaps and irregularities on the surfaces, thereby reducing thermal resistance.

The container 1202 includes a plurality of chassis 1204, each of which can be configured to mount a respective PCB 1208. In some examples, a chassis 1204 includes slots or grooves that are configured to slide in and hold a respective PCB 1208. The slots or grooves provide mechanical support and alignment, ensuring that the PCBs 1208 are properly positioned within the container 1202. The chassis 1204 can allow for easy installation and removal of the PCBs 1208, facilitating maintenance and upgrades.

In addition to the slots or grooves, the chassis 1204 may also include features such as spring-loaded clamps or locking mechanisms that help to secure the PCBs 1208 in place, preventing movement or vibration that could disrupt the electrical connections or cause mechanical damage.

Couplers 1210 are used to couple the PCBs 1208 to the container 1202. In some examples, the couplers 1210 can take various forms, such as screws, clamps, or snap-fit connectors, depending on the specific design requirements of the device 1200. The couplers 1210 can provide a secure and stable connection between the PCBs 1208 and the container 1202, ensuring that the PCBs 1208 remain firmly in place during operation. The use of couplers 1210 also allows for modularity, making it easier to replace or upgrade individual PCBs 1208 without disturbing the entire assembly.

Figure 13:
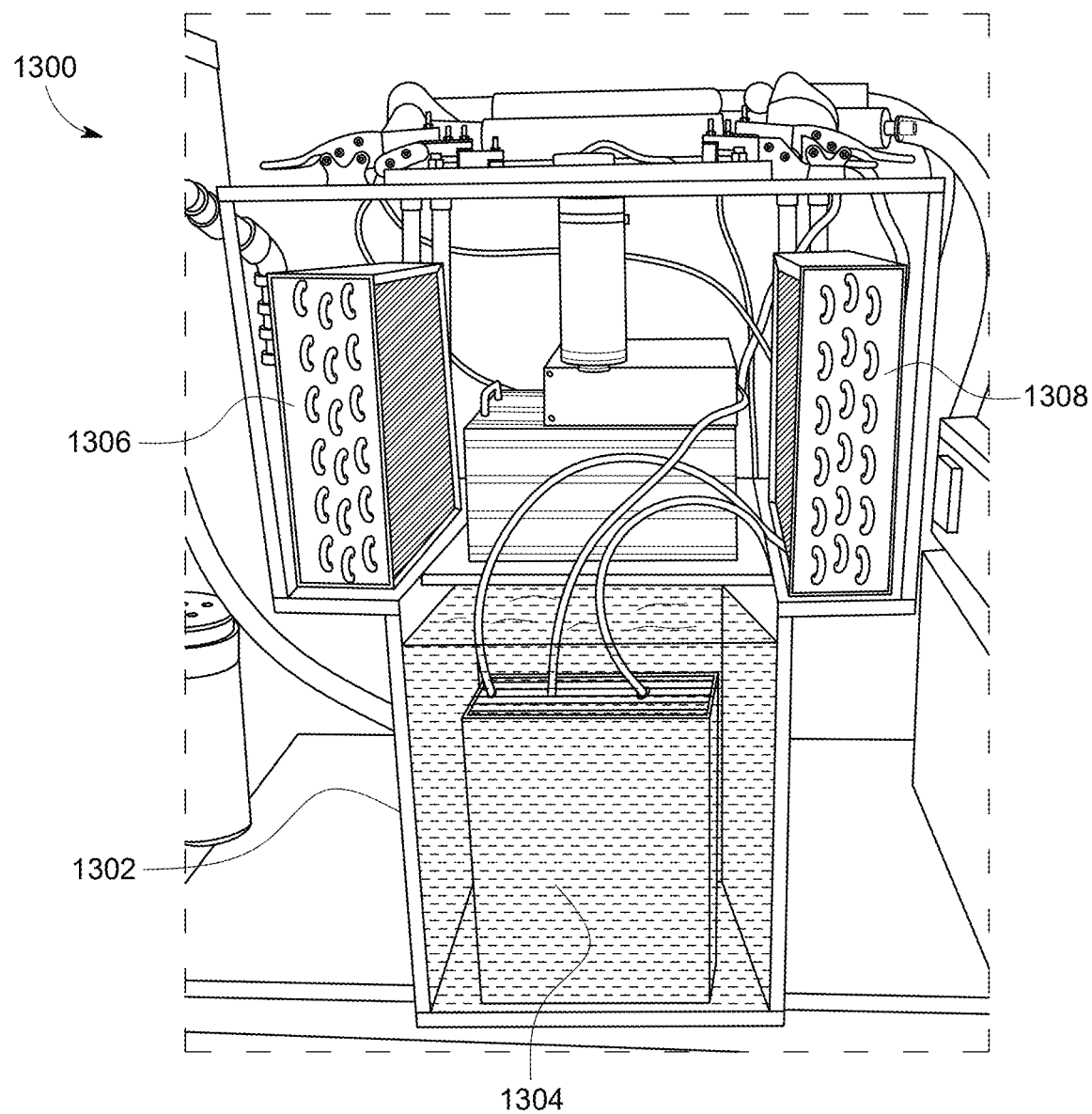
FIG. 13 illustrates an example system, according to one or more implementations of the present disclosure.

FIG. 13 illustrates an example system 1300, according to one or more implementations of the present disclosure. In some implementations, the system 1300 is configured for advanced thermal management of electronic components through immersion cooling. As shown, the system 1300 includes a tank 1302 filled with a cooling fluid, a device 1304 immersed in the fluid within the tank 1302, and additional devices 1306 and 1308 (e.g., heat exchangers or condensers). In some implementations, the device 1304 can be an implementation of the device 1000 of FIG. 10 or the device 1200 of FIG. 12, configured for use in immersion cooling applications.

In some implementations, the device 1304 is configured to house a plurality of PCBs, such as the PCBs 1208 of FIG. 12. The PCBs are immersed in the cooling fluid within the tank 1302, allowing the fluid to absorb and dissipate heat generated by the electronic components. Each PCB can include one or more IC chips (e.g., IC chips 104 of FIG. 1A) with a TIM (e.g., TIM 106 of FIG. 1A) coating the surfaces of the IC chips that are coupled to a boilerplate (e.g., boilerplate 1206 of FIG. 12). The TIM can improve thermal transfer between the IC chips and the boilerplate, enhancing the overall cooling efficiency of the system.

To further improve cooling performance, at least one baffle cover (e.g., baffle cover 1004 of FIG. 10) can be positioned along an edge of the PCBs. The baffle cover can be configured to control the movement of the cooling fluid, particularly at the edges of the PCBs, where fluid dynamics can be important. In some examples, the baffle cover includes one or more openings that are configured to control the agitation of the cooling fluid proximate to the edge of the PCB. The openings can be configured to either enhance fluid flow to increase heat dissipation or reduce turbulence to protect the TIM from being displaced, depending on the specific cooling requirements.

In some implementations, the device 1304 includes a container (e.g., container 1002 of FIG. 10) that houses the PCBs. The container can include at least one chassis (e.g., chassis 1204 of FIG. 12) for securely mounting the PCBs, ensuring that they remain stable during operation. The container of the device 1304 can further include one or more couplers, such as screws or clamps, positioned along a side of the container to hold the baffle cover in place. The PCBs are mounted on the chassis with their edges proximate to the side of the container. This configuration can ensure that the baffle cover encloses the PCBs within the container, creating a controlled environment for the cooling fluid flow.

When the container of the device 1304 is immersed in the cooling fluid within the tank 1302, its side faces the surface of the cooling fluid, allowing for increased interaction between the fluid and the PCBs. With such configuration, the cooling fluid can flow around and across the PCBs, aided by the placement of the baffle cover, which manages the fluid dynamics to enhance thermal management.

In some implementations, the container of the device 1304 is immersed in the cooling fluid in the tank 1302 in a vertical orientation. This vertical orientation can improve the natural convection currents within the cooling fluid, promoting efficient heat dissipation. The baffle cover can be positioned along the top edge of the PCBs, which is proximate to the upper surface of the cooling fluid. This placement helps to manage the fluid flow at an interface where the cooling fluid interacts with the ambient environment, improving heat transferred away from the electronic components.

In some implementations, the PCBs themselves are immersed in the cooling fluid in a vertical orientation within the tank 1302. The baffle cover can be coupled to the top side of the container of the device 1304, which is near the upper surface of the cooling fluid. This configuration can allow the baffle cover to manage the flow and agitation of the cooling fluid near the top of the tank, where thermal gradients can be most pronounced. By controlling the fluid dynamics at this location, the system can prevent hotspots and ensure uniform cooling across all PCBs.

In some implementations, controlling the agitation of the cooling fluid proximate to the edge of the PCBs involves preventing the TIM from being displaced by the movement of the cooling fluid. This can be useful in high-flow or turbulent cooling environments, where the physical stability of the TIM is desired to maintain consistent thermal performance.

In some implementations, the device 1304 includes a first baffle cover and a second baffle cover, which are positioned in parallel along two opposing sides of the container of the device 1304. The PCBs are positioned between the first baffle cover and the second baffle cover. This dual-baffle configuration can allow for enhanced control of the cooling fluid flow on both sides of the PCBs, creating a balanced and efficient thermal management system. The parallel baffle covers can direct the cooling fluid in a coordinated manner, either channeling it along the length of the PCBs for uniform cooling or creating zones of increased agitation for targeted cooling in high-heat areas.

In some implementations, the device 1304 include angled or adjustable baffle covers, which allow for customization of the fluid flow based on specific operational needs. For example, the baffle covers can be configured to create a laminar flow across the PCBs in one scenario or induce turbulence in another, depending on the desired cooling effect. Additionally, the baffle covers can be made from different materials, such as high-conductivity metals or composite materials, to further enhance their performance in specific cooling environments.

While this document may describe many specifics, these should not be construed as limitations on the scope of an invention that is claimed or of what may be claimed, but rather as descriptions of features specific to particular implementations. Certain features that are described in this document in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A device, comprising:
   a substrate;
   one or more integrated circuit (IC) chips placed on the substrate; and
   a boilerplate comprising one or more rails, wherein at least one rail of the one or more rails comprises a recess in a surface of the at least one rail that faces the one or more IC chips, wherein the recess comprises outer walls contacting the one or more IC chips and forming a cavity for accommodating a thermal interface material (TIM) coupled to the one or more IC chips.

2. The device of claim 1, wherein the at least one rail comprises a plurality of sections that are separated from each other, wherein each one of the plurality of sections comprises a recess that corresponds to a respective IC chip of the one or more IC chips and that comprises outer walls forming a cavity for accommodating a TIM coupled to the respective IC chip.

3. The device of claim 1, wherein the boilerplate comprises a first surface coupled to the one or more IC chips and a second surface opposite the first surface, and wherein the second surface has a roughness exceeding a predetermined threshold.

4. The device of claim 3, wherein the second surface of the boilerplate has a roughness within a range of 1.7 to 2.3 micrometers.

5. The device of claim 3, wherein the roughness of the second surface of the boilerplate comprises a plurality of ridges with intervening valleys.

6. The device of claim 3, wherein the roughness of the second surface of the boilerplate is processed using one of sand blasting or bead blasting.

7. The device of claim 1, wherein the boilerplate comprises a thermally conductive material.

8. The device of claim 1, wherein the TIM comprises one of the following:
   a thermal paste,
   a thermal adhesive,
   a thermal conductive pad,
   a thermal tape, or
   a phase-change material.

9. A device, comprising:
   a substrate;
   one or more integrated circuit (IC) chips placed on the substrate; and
   a boilerplate comprising a first surface coupled to the one or more IC chips and a second surface opposite the first surface, wherein the second surface has a roughness exceeding a predetermined threshold, and the roughness of the second surface comprises a plurality of ridges with intervening valleys.

10. The device of claim 9, wherein the second surface of the boilerplate has a roughness within a range of 1.7 to 2.3 micrometers.

11. The device of claim 9, wherein the second surface of the boilerplate is generated using one of sand blasting or bead blasting.

12. The device of claim 9, wherein the boilerplate comprises one or more rails, at least one rail of the one or more rails comprises a recess in a surface of the at least one rail that faces the one or more IC chips, and the recess comprises outer walls contacting the one or more IC chips and forming a cavity for accommodating a thermal interface material (TIM) coupled to the one or more IC chips.

13. The device of claim 12, wherein the at least one rail comprises a plurality of sections that are separated from each other, wherein each one of the plurality of sections comprises a recess that corresponds to a respective IC chip of the one or more IC chips and that comprises outer walls forming a cavity for accommodating a TIM coupled to the respective IC chip.

14. The device of claim 12, wherein the TIM comprises one of the following:
   a thermal paste,
   a thermal adhesive,
   a thermal conductive pad,
   a thermal tape, or
   a phase-change material.

15. The device of claim 9, wherein the boilerplate comprises a thermally conductive material.

16. A boilerplate for coupling to one or more integrated circuit (IC) chips placed on a printed circuit board (PCB), wherein:
   the boilerplate comprises one or more rails, wherein at least one rail of the one or more rails comprises a recess in a surface of the at least one rail that faces the one or more IC chips, wherein the recess comprises outer walls contacting the one or more IC chips and forming a cavity for accommodating a thermal interface material (TIM) coupled to the one or more IC chips; and
the boilerplate comprises a first surface coupled to the one or more IC chips and a second surface opposite the first surface, wherein the second surface has a roughness exceeding a predetermined threshold, and the roughness of the second surface comprises a plurality of ridges with intervening valleys.

17. The boilerplate of claim 16, wherein the at least one rail comprises a plurality of sections that are separated from each other, wherein each one of the plurality of sections comprises a recess that corresponds to a respective IC chip of the one or more IC chips and that comprises outer walls forming a cavity for accommodating a TIM coupled to the respective IC chip.

18. The boilerplate of claim 16, wherein the boilerplate comprises a thermally conductive material.

19. The boilerplate of claim 16, wherein the second surface of the boilerplate has a roughness within a range of 1.7 to 2.3 micrometers.

20. The boilerplate of claim 16, wherein the second surface of the boilerplate is generated using one of sand blasting or bead blasting.

* * * * *